United States Patent
Goktepeli

(10) Patent No.: US 9,917,062 B1
(45) Date of Patent: Mar. 13, 2018

(54) SELF-ALIGNED TRANSISTORS FOR DUAL-SIDE PROCESSING

(71) Applicant: Qualcomm Incorporated, San Diego, CA (US)

(72) Inventor: Sinan Goktepeli, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/266,972

(22) Filed: Sep. 15, 2016

(51) Int. Cl.
| H01L 23/544 | (2006.01) |
| H01L 27/12 | (2006.01) |
| H01L 21/683 | (2006.01) |
| H01L 21/84 | (2006.01) |
| H01L 21/762 | (2006.01) |
| H01L 27/13 | (2006.01) |

(52) U.S. Cl.
CPC ........ H01L 23/544 (2013.01); H01L 21/6835 (2013.01); H01L 21/76224 (2013.01); H01L 21/84 (2013.01); H01L 27/1203 (2013.01); H01L 27/1211 (2013.01); H01L 27/13 (2013.01); H01L 2221/6835 (2013.01)

(58) Field of Classification Search
CPC .................................................... H01L 23/544
See application file for complete search history.

(56) References Cited

U.S. PATENT DOCUMENTS

| 7,566,974 | B2 | 7/2009 | Konevecki et al. |
| 7,816,231 | B2 | 10/2010 | Dyer et al. |
| 7,829,437 | B2 | 11/2010 | Kim et al. |
| 8,574,929 | B1 | 11/2013 | Or-Bach et al. |
| 9,165,829 | B2 | 10/2015 | Lee |
| 2008/0179678 | A1* | 7/2008 | Dyer ....................... H01L 21/84 257/351 |
| 2010/0224876 | A1* | 9/2010 | Zhu .................... H01L 21/76898 257/52 |
| 2011/0121369 | A1* | 5/2011 | Anderson ........... G06F 17/5045 257/255 |
| 2012/0187375 | A1* | 7/2012 | Guo ....................... H01L 21/845 257/24 |
| 2012/0187530 | A1* | 7/2012 | Zhang ................... H01L 23/645 257/531 |
| 2013/0015502 | A1 | 1/2013 | Fox et al. |
| 2013/0122672 | A1 | 5/2013 | Or-Bach et al. |
| 2014/0001572 | A1* | 1/2014 | Bohr ............... H01L 21/823821 257/401 |
| 2015/0230720 | A1* | 8/2015 | Hekmatshoartabari A61B 5/04001 600/377 |
| 2016/0111369 | A1 | 4/2016 | Or-Bach et al. |

OTHER PUBLICATIONS

International Search Report and Written Opinion—PCT/US2017/047189—ISA/EPO—dated Oct. 24, 2017.

* cited by examiner

Primary Examiner — Benjamin Sandvik
(74) Attorney, Agent, or Firm — Seyfarth Shaw LLP

(57) ABSTRACT

An integrated circuit structure may include an alignment column on a front-side surface of an isolation layer. The alignment column may extend through a backside surface opposite the front-side surface of the isolation layer. The integrated circuit structure may also include front-side transistors on the front-side surface of the isolation layer. The integrated circuit structure may further include backside transistors on the backside surface of the isolation layer. A first front-side transistor is aligned with a first backside transistor according to the alignment column.

13 Claims, 22 Drawing Sheets

SELF-ALIGNED TRANSISTORS FOR DUAL-SIDE PROCESSING

TECHNICAL FIELD

The present disclosure generally relates to integrated circuits (ICs). More specifically, the present disclosure relates to self-aligned transistors for dual-side processing.

BACKGROUND

Mobile radio frequency (RF) chip designs (e.g., mobile RF transceivers), including high performance diplexers have migrated to a deep sub-micron process node due to cost and power consumption considerations. The design of such mobile RF transceivers becomes complex at this deep sub-micron process node. The design complexity of these mobile RF transceivers is further complicated by added circuit functions to support communication enhancements, such as carrier aggregation. Further design challenges for mobile RF transceivers include analog/RF performance considerations, such as mismatch, noise and other performance considerations. The design of these mobile RF transceivers includes the use of additional passive devices, for example, to suppress resonance, and/or to perform filtering, bypassing, and coupling.

The design of these mobile RF transceivers may include the use of silicon on insulator (SOI) technology. SOI technology replaces conventional silicon substrates with a layered silicon-insulator-silicon substrate to reduce parasitic device capacitance and improve performance. SOI-based devices differ from conventional, silicon-built devices because the silicon junction is above an electrical isolator, typically a buried oxide (BOX) layer. A reduced thickness BOX layer, however, may not sufficiently reduce the parasitic capacitance caused by the proximity of an active device on the silicon layer and a substrate supporting the BOX layer.

The active devices on the SOI layer may include complementary metal oxide semiconductor (CMOS) transistors. The process flow for semiconductor fabrication of CMOS transistors is generally performed during front-end-of-line (FEOL) processes. The front-end-of-line processes may include the set of process steps that form the active devices (e.g., transistors). The FEOL processes include ion implantation, anneals, oxidation, chemical vapor deposition (CVD) or atomic layer deposition (ALD), etching, chemical mechanical polishing (CMP), and epitaxy. Unfortunately, these FEOL processes are generally limited to CMOS transistor formation on one side of a semiconductor wafer.

SUMMARY

An integrated circuit structure may include an alignment column on a front-side surface of an isolation layer. The alignment column may extend through a backside surface opposite the front-side surface of the isolation layer. The integrated circuit structure may also include front-side transistors on the front-side surface of the isolation layer. The integrated circuit structure may further include backside transistors on the backside surface of the isolation layer. The isolation layer may also include a first front-side transistor that is aligned with a first backside transistor according to the alignment column.

A method of constructing an integrated circuit structure may include forming an alignment column on a front-side surface of an isolation layer. The alignment column may extend through a backside surface opposite the front-side surface of the isolation layer. The method may also include fabricating a front-side transistor on the front-side surface of the isolation layer. The method may further include bonding a handle substrate to a front-side dielectric layer on the front-side transistor. The method may also include fabricating a backside transistor on the backside surface of the isolation layer. The backside transistor may align with the front-side transistor according to the alignment column.

An integrated circuit structure may include front-side transistors on a front-side surface of an isolation layer. The integrated circuit structure may also include backside transistors on a backside surface of the isolation layer. The integrated circuit may further include a means for aligning a first front-side transistor with a first backside transistor.

A radio frequency (RF) front end module may include an integrated RF circuit structure. The RF circuit structure may include an alignment column on a front-side surface of an isolation layer and extending through a backside surface opposite the front-side surface of the isolation layer. The isolation layer may include front-side transistors on the front-side surface of the isolation layer. The isolation layer may also include backside transistors on the backside surface of the isolation layer. A first front-side transistor may be aligned with a first backside transistor according to the alignment column. The RF front end module may also include a switch transistor composed of the first front-side transistor and the first backside transistor. The front end module may further include an antenna coupled to an output of the switch transistor.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1A:
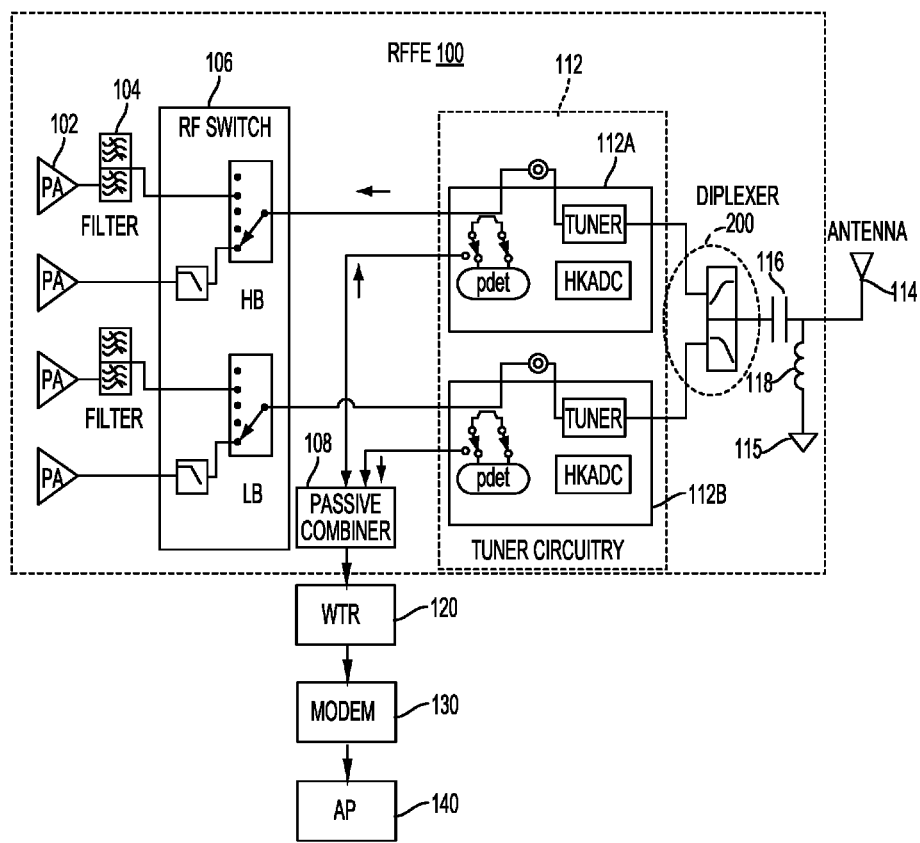
FIG. 1A is a schematic diagram of a radio frequency (RF) front end (RFFE) module.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent to those skilled in the art, however, that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Mobile radio frequency (RF) chip designs (e.g., mobile RF transceivers) have migrated to a deep sub-micron process node due to cost and power consumption considerations. The design complexity of mobile RF transceivers is further complicated by added circuit functions to support communication enhancements, such as carrier aggregation.

The design of these mobile RF transceivers may include the use of silicon on insulator (SOI) technology. SOI technology replaces conventional silicon substrates with layered silicon-insulator-silicon substrates to reduce parasitic device capacitance and improve performance. SOI-based devices differ from conventional, silicon-built devices because the silicon junction is above an electrical isolator, typically a buried oxide (BOX) layer, in which a thickness of the BOX layer may be reduced. A reduced thickness BOX layer, however, may not sufficiently reduce the parasitic capacitance caused by the proximity of an active device on the silicon layer and a substrate supporting the BOX layer.

The active devices on the SOI layer may include complementary metal oxide semiconductor (CMOS) transistors. The process flow for semiconductor fabrication of CMOS transistors is generally performed during front-end-of-line (FEOL) processes. The front-end-of-line processes may include the set of process steps that form the active devices (e.g., transistors). The FEOL processes include ion implantation, anneals, oxidation, chemical vapor deposition (CVD) or atomic layer deposition (ALD), etching, chemical mechanical polishing (CMP), and epitaxy. Unfortunately, these FEOL processes are generally limited to CMOS transistor formation on one side of a semiconductor wafer. That is, conventional CMOS transistor fabrication technology is limited to transistor fabrication on a front-side of the semiconductor, which limits transistor density. As a result, aspects of the present disclosure include a post-layer transfer process to enable self-aligned transistors for dual-side processing.

Various aspects of the disclosure provide techniques of forming self-aligned transistors within an integrated circuit structure that are fabricated using dual-side processing. The process flow for semiconductor fabrication of the integrated circuit structure may include front-end-of-line (FEOL) processes, middle-of-line (MOL) (also referred to as middle end of line (MEOL)) processes, and back-end-of-line (BEOL) processes. The middle-of-line processes may include the set of process steps that enable connection of the transistors to BEOL interconnects. These steps include silicidation and contact formation as well as stress introduction. The back-end-of-line processes may include the set of process steps that form the interconnect that ties the independent transistors and form circuits. Currently, copper and aluminum are materials to form the interconnects, but with further development of the technology other conductive material may be used.

It will be understood that the term "layer" includes film and is not to be construed as indicating a vertical or horizontal thickness unless otherwise stated. As described herein, the term "substrate" may refer to a substrate of a diced wafer or may refer to a substrate of a wafer that is not diced. Similarly, the terms chip and die may be used interchangeably unless such interchanging would tax credulity.

Aspects of the present disclosure describe dual-sided, self-aligned transistors that may be used as antenna switch transistors in integrated radio frequency (RF) circuit structures for high quality (Q)-factor RF applications. The alignment is achieved without markers from a photo tool, resulting in up to 60% area savings. In one configuration, a pre-layer transfer process forms front-side transistors. In addition, a post-layer transfer process forms backside transistors that may be self-aligned or offset from the front-side transistors relative to alignment columns. The post-layer transfer process may form fin-type field effect transistors (FinFETs), in which a front-side fin of the first front-side transistor is aligned with a backside fin of the first backside transistor. The post-layer transfer process may also form the front-side transistors and the backside transistors as gate all around nanowires, nanowires, vertical transistors, or planar CMOS transistors.

FIG. 1A is a schematic diagram of a radio frequency (RF) front end (RFFE) module 100 employing a diplexer 200. The RF front end module 100 includes power amplifiers 102, duplexer/filters 104, and a radio frequency (RF) switch module 106. The power amplifiers 102 amplify signal(s) to a certain power level for transmission. The duplexer/filters 104 filter the input/output signals according to a variety of different parameters, including frequency, insertion loss, rejection or other like parameters. In addition, the RF switch module 106 may select certain portions of the input signals to pass on to the rest of the RF front end module 100.

The RF front end module 100 also includes tuner circuitry 112 (e.g., first tuner circuitry 112A and second tuner circuitry 112B), the diplexer 200, a capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1A, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130, and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then a signal with the particular frequency is transmitted or received by the antenna 114. Although a single capacitor and inductor are shown, multiple components are also contemplated.

Figure 1B:
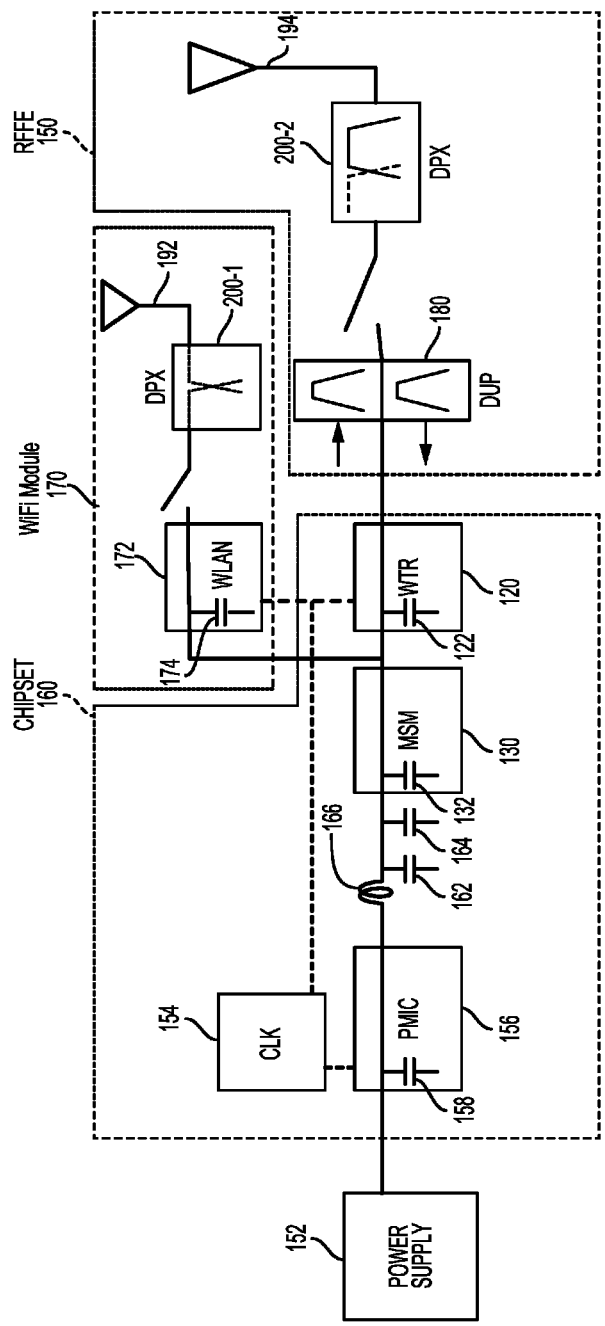
FIG. 1B is a schematic diagram of a radio frequency (RF) front end (RFFE) module employing diplexers for a chipset to provide carrier aggregation.

FIG. 1B is a schematic diagram of a wireless local area network (WLAN) (e.g., WiFi) module 170 including a first diplexer 200-1 and an RF front end module 150 including a second diplexer 200-2 for a chipset 160 to provide carrier aggregation. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity. The PMIC 156, the modem 130, the wireless transceiver 120, and the WLAN module 172 each include capacitors (e.g., 158, 132, 122, and 174) and operate according to a clock 154. The geometry and arrangement of the various inductor and capacitor components in the chipset 160 may reduce the electromagnetic coupling between the components.

Figure 2A:
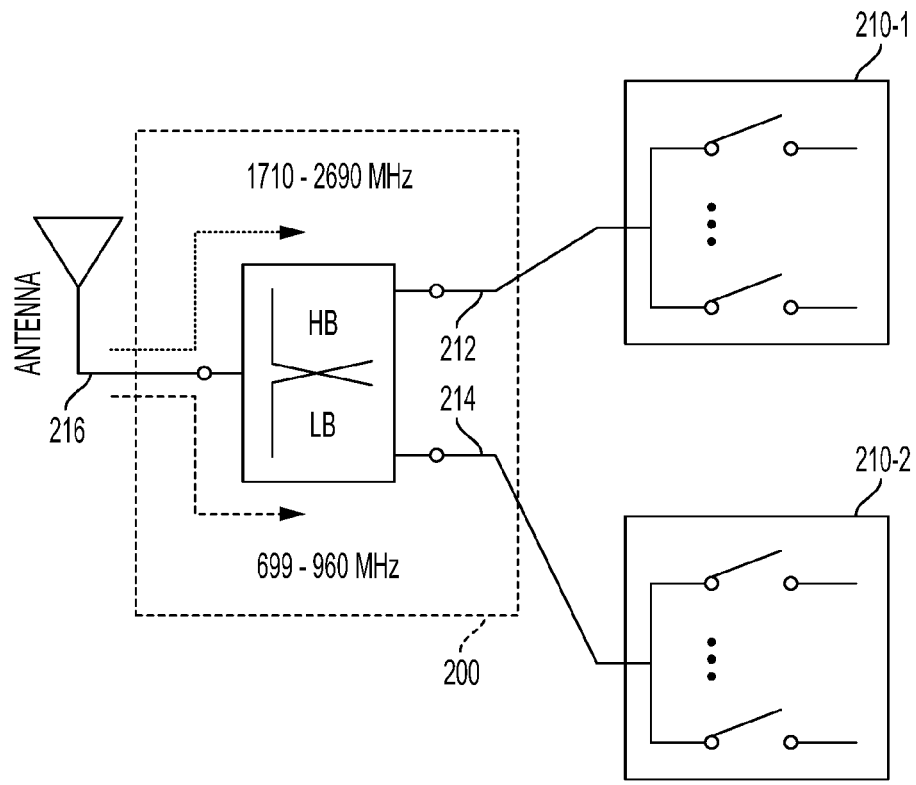
FIG. 2A is a diagram of a diplexer design.

FIG. 2A is a diagram of a diplexer 200. The diplexer 200 includes a high band (HB) input port 212, a low band (LB) input port 214, and an antenna 216. A high band path of the diplexer 200 includes a high band antenna switch 210-1. A low band path of the diplexer 200 includes a low band antenna switch 210-2. A wireless device including an RF front end module may use the antenna switches 210 and the diplexer 200 to enable a wide range band for an RF input and an RF output of the wireless device. In addition, the antenna 216 may be a multiple input, multiple output (MIMO) antenna. Multiple input, multiple output antennas will be widely used for the RF front end of wireless devices to support features such as carrier aggregation.

Figure 2B:
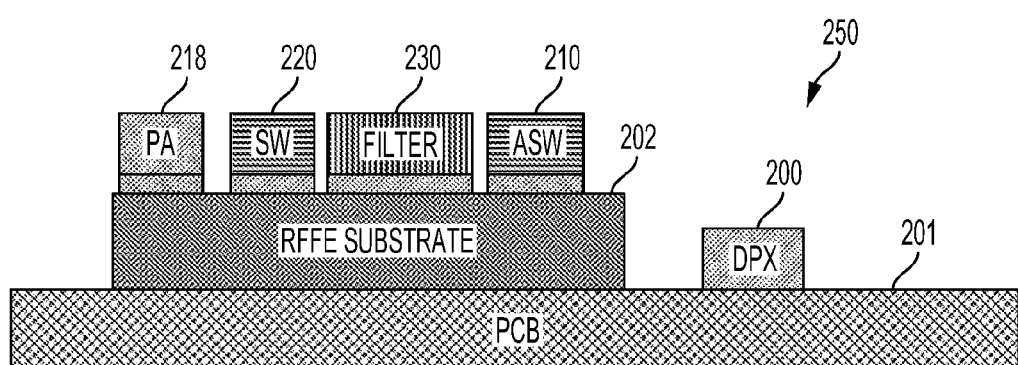
FIG. 2B is a diagram of a radio frequency (RF) front end module.

FIG. 2B is a diagram of an RF front end module 250. The RF front end module 250 includes the antenna switch (ASW) 210 and diplexer 200 (or triplexer) to enable the wide range band noted in FIG. 2A. In addition, the RF front end module 250 includes filters 230, an RF switch 220, and power amplifiers 218 supported by a substrate 202. The filters 230 may include various LC filters, having inductors (L) and capacitors (C) arranged along the substrate 202 for forming a diplexer, a triplexer, low pass filters, balun filters, and/or notch filters to prevent high order harmonics in the RF front end module 250. The diplexer 200 may be implemented as a surface mount device (SMD) on a system board 201 (e.g., printed circuit board (PCB) or package substrate). Alternatively, the diplexer 200 may be implemented on the substrate 202.

In this configuration, the RF front end module 250 is implemented using silicon on insulator (SOI) technology, which helps reduce high order harmonics in the RF front end module 250. SOI technology replaces conventional silicon substrates with a layered silicon-insulator-silicon substrate to reduce parasitic device capacitance and improve performance. SOI-based devices differ from conventional silicon-built devices because the silicon junction is above an electrical insulator, typically a buried oxide (BOX) layer. A reduced thickness BOX layer, however, may not sufficiently reduce the parasitic capacitance caused by the proximity between an active device (on the silicon layer) and a substrate supporting the BOX layer. As a result, aspects of the present disclosure include a layer transfer process to further separate the active device from the substrate, as shown in FIGS. 3A to 3E.

Figure 3A:
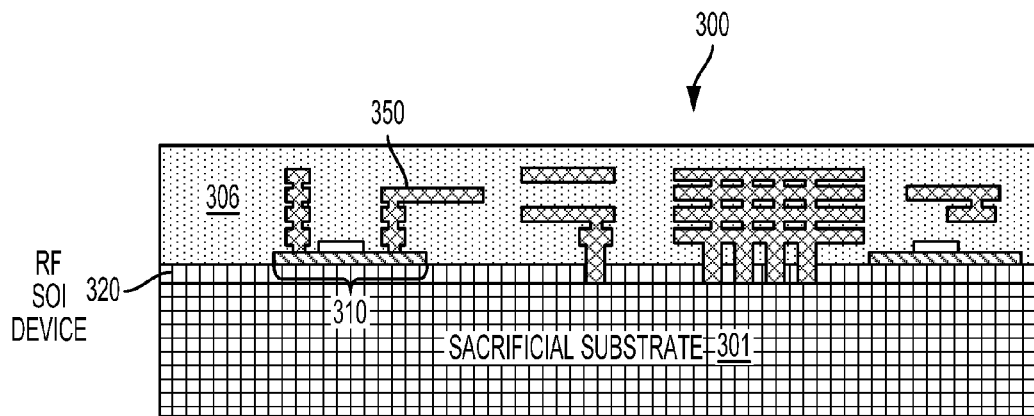
FIGS. 3A to 3E show cross-sectional views of an integrated radio frequency (RF) circuit structure during a layer transfer process.
Figure 3B:
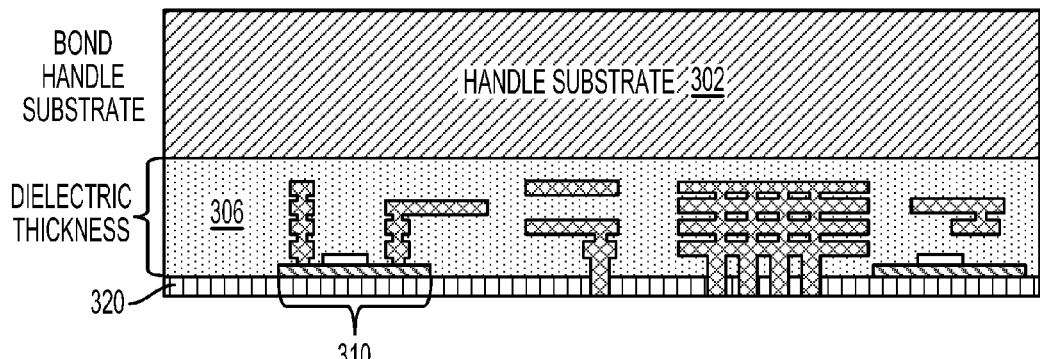

FIGS. 3A to 3E show cross-sectional views of an integrated radio frequency (RF) circuit structure 300 during a layer transfer process. As shown in FIG. 3A, an RF silicon on insulator (SOI) device includes an active device 310 on a buried oxide (BOX) layer 320 supported by a sacrificial substrate 301 (e.g., a bulk wafer). The RF SOI device also includes interconnects 350 coupled to the active device 310 within a first dielectric layer 306. As shown in FIG. 3B, a handle substrate 302 is bonded to the first dielectric layer 306 of the RF SOI device. In addition, the sacrificial substrate 301 is removed. Removal of the sacrificial substrate 301 using the layer transfer process enables high-performance, low-parasitic RF devices by increasing the dielectric thickness. That is, a parasitic capacitance of the RF SOI device is proportional to the dielectric thickness, which determines the distance between the active device 310 and the handle substrate 302.

Figure 3C:
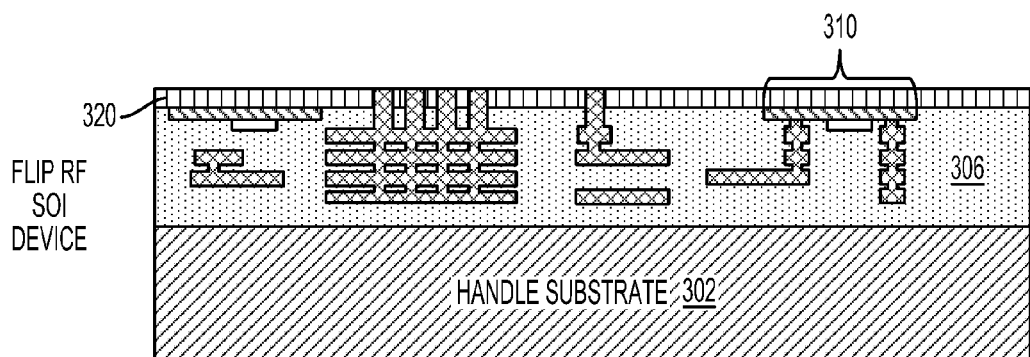
Figure 3D:
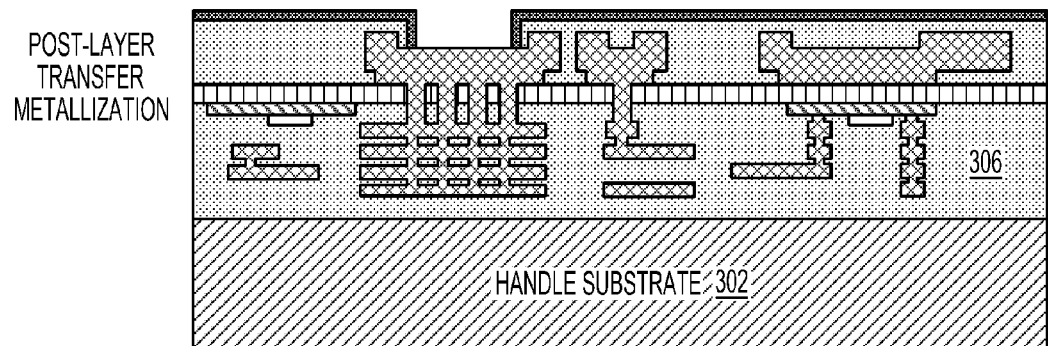
Figure 3E:
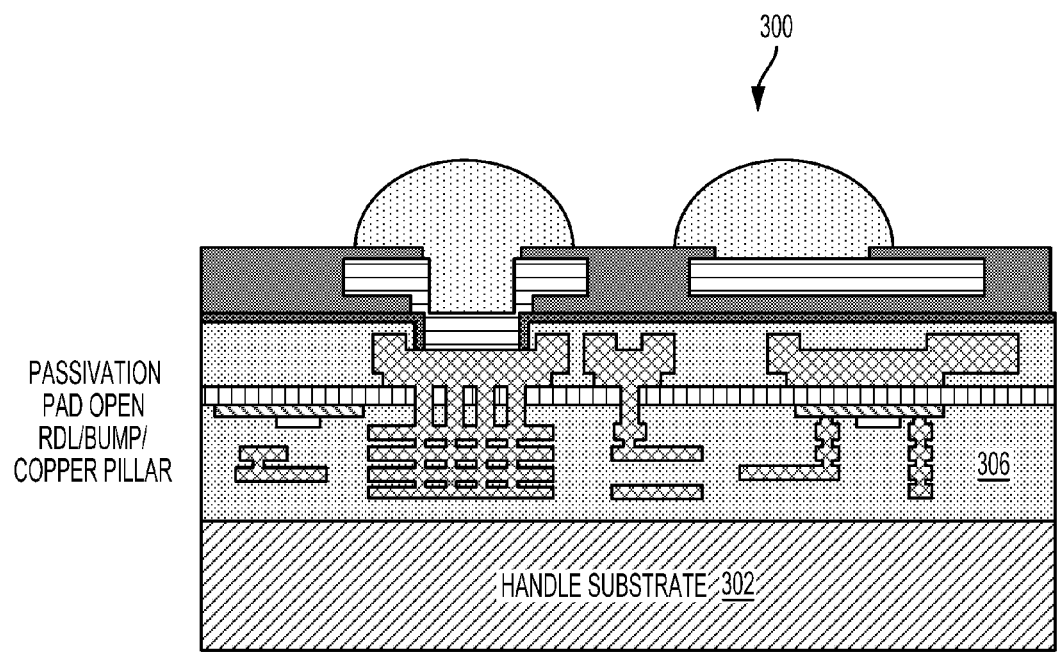

As shown in FIG. 3C, the RF SOI device is flipped once the handle substrate 302 is secured and the sacrificial substrate 301 is removed. As shown in FIG. 3D, a post-layer transfer metallization process is performed using, for example, a regular complementary metal oxide semiconductor (CMOS) process. As shown in FIG. 3E, an integrated RF circuit structure 300 is completed by depositing a passivation layer, opening bond pads, depositing a redistribution layer, and forming conductive bumps/pillars to enable bonding of the integrated RF circuit structure 300 to a system board (e.g., a printed circuit board (PCB)).

Referring again to FIG. 3A, the sacrificial substrate 301 may be removed, with a handle substrate attached such that a thickness of the BOX layer 320 may be increased to improve harmonics. Although this arrangement of the RF SOI device may provide improved harmonics relative to a pure silicon or SOI implementation, the RF SOI device is limited by the non-linear responses from the handle substrate, especially when a silicon handle substrate is used. That is, in FIG. 3A, the increased thickness of the BOX layer 320 does not provide sufficient distance between the active device 310 and the sacrificial substrate 301 (FIG. 3A) relative to the configurations shown in FIGS. 3B to 3E, including the handle substrate 302. Moreover, the RF SOI device is generally limited to CMOS transistor formation on one side of the SOI layer.

Figure 4:
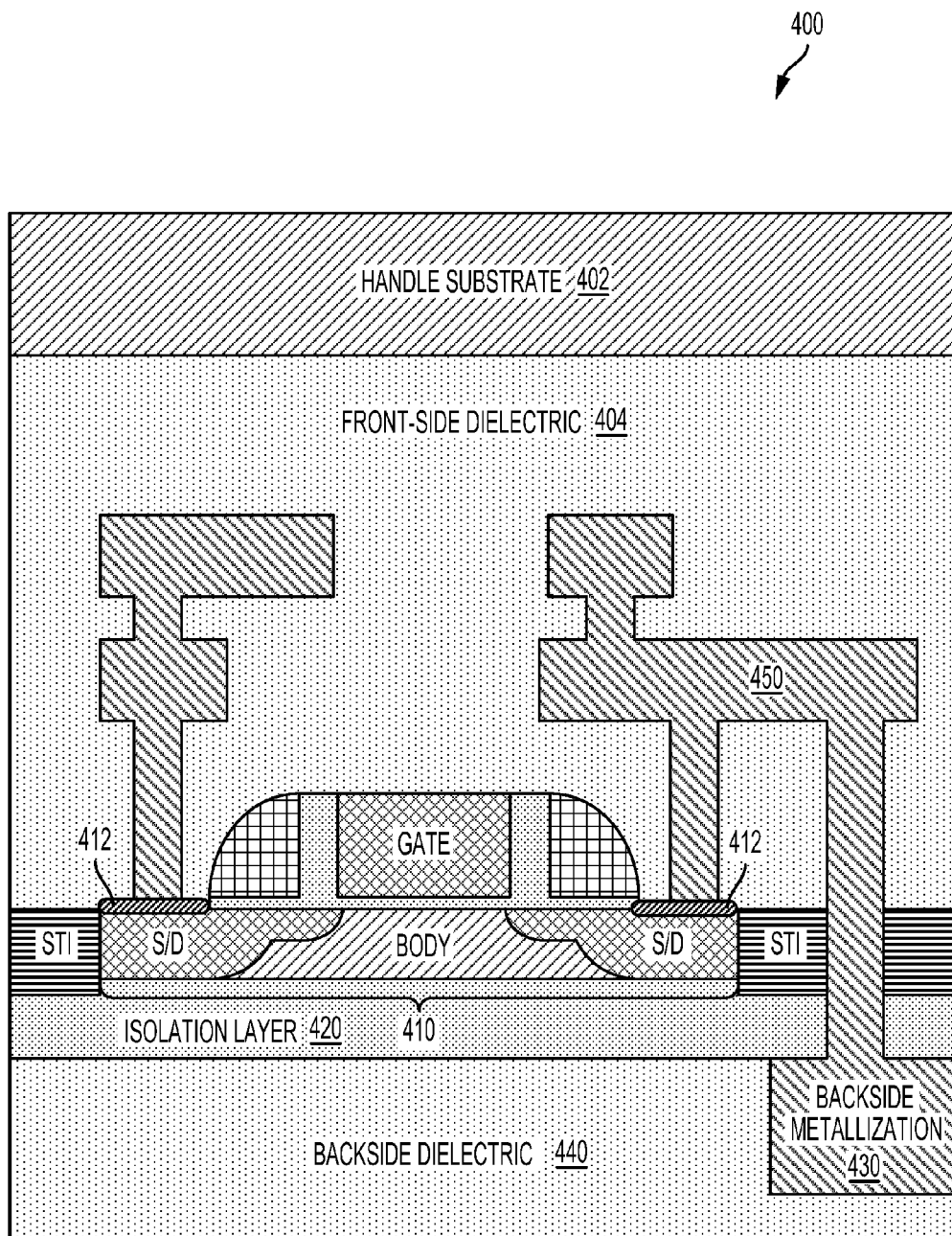
FIG. 4 is a cross-sectional view of an integrated radio frequency (RF) circuit structure fabricated using a layer transfer process.

FIG. 4 is a cross-sectional view of an integrated RF circuit structure 400 fabricated using a layer transfer process. Representatively, the integrated RF circuit structure 400 includes an active device 410 having a gate, a body, and source/drain regions formed on an isolation layer 420. In silicon on insulator (SOI) implementations, the isolation layer 420 is a buried oxide (BOX) layer, and the body and source/drain regions are formed from an SOI layer including shallow trench isolation (STI) regions supported by the BOX layer.

The integrated RF circuit structure 400 also includes middle-end-of-line (MEOL)/back-end-of-line (BEOL) interconnects coupled to the source/drain regions of the active device 410. As described, the MEOL/BEOL layers are referred to as front-side layers. By contrast, the layers supporting the isolation layer 420 may be referred to as backside layers. According to this nomenclature, a front-side interconnect 450 is coupled to the source/drain regions of the active device 410 through front-side contacts 412 in a front-side dielectric layer 404. In addition, a handle substrate 402 is coupled to the front-side dielectric layer 404. In this configuration, a backside dielectric 440 is adjacent to and possibly supports the isolation layer 420. In addition, a backside metallization 430 is coupled to the front-side interconnect 450.

As shown in FIG. 4, a layer transfer process increases separation between the active device 410 and the handle substrate 402 to improve the harmonics of the integrated RF circuit structure 400. While the layer transfer process enables high-performance, low-parasitic RF devices, the integrated RF circuit structure 400 is limited to CMOS transistor formation on the front-side of the integrated RF circuit structure 400. That is, conventional CMOS transistor fabrication technology is limited to transistor fabrication on a front-side of a semiconductor wafer, which limits transistor density. As a result, aspects of the present disclosure include a post-layer transfer process to enable formation of dual-sided, self-aligned transistors.

Various aspects of the disclosure provide techniques for a post-layer transfer process to enable self-aligned transistors for dual-side processing within an integrated circuit structure. By contrast, access to active devices, formed during a front-end-of-line (FEOL) process, is conventionally provided during middle-end-of-line (MEOL) processing that provides contacts between the gates and source/drain regions of the active devices and back-end-of-line (BEOL) interconnect layers (e.g., M1, M2, etc.). Aspects of the present disclosure involve a post-layer transfer process for forming dual-sided, self-aligned transistors that may be used as antenna switch transistors in integrated radio frequency (RF) circuit structures for high quality (Q)-factor RF applications. Other applications include an active device in a low power amplifier module, a low noise amplifier, and an antenna diversity switch.

Figure 5:
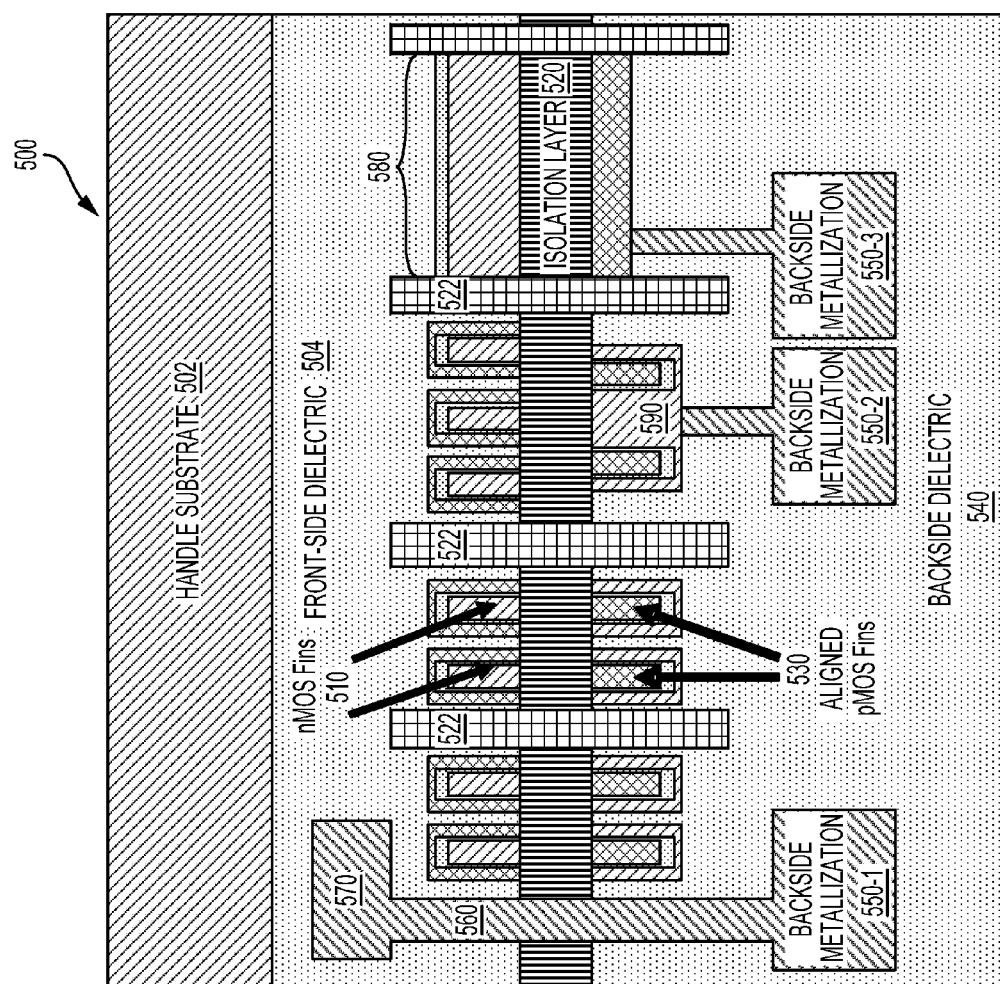
FIG. 5 is a cross-sectional view of an integrated circuit structure, including dual-sided, self-aligned active devices, according to aspects of the present disclosure.

FIG. 5 is a cross-sectional view of an integrated circuit structure 500, including dual-sided, self-aligned active devices (e.g., transistors), according to aspects of the present disclosure. In aspects of the present disclosure, a post-layer transfer process enables the formation of dual-sided, self-aligned transistors, which solves the problem of reduced transistor density associated with conventional CMOS fabrication processes. Representatively, the integrated circuit structure 500 includes front-side transistors 510 formed on a first surface of an isolation layer 520. The isolation layer 520 may be a buried oxide (BOX) layer for a silicon on insulator (SOI) implementation, in which the body and source/drain regions are formed from an SOI layer. In this configuration, the front-side transistors 510 are shown as negative metal oxide semiconductor (NMOS) fin-type field effect transistors (FinFETs). Configuring the front-side transistors 510 as the same type (n-type/p-type) simplifies the semiconductor fabrication process, such as the implant (or epitaxial growth) process for doping the n-type and p-type semiconductor regions as well as gate formation. It should be recognized that other active device configurations and polarity types are possible according to aspects of the present disclosure.

In this aspect of the present disclosure, the integrated circuit structure also includes backside transistors 530 on a second surface opposite the first surface of the isolation layer 520. The backside transistors 530 are self-aligned with the front-side transistors 510 relative to alignment columns 522. In this configuration, the backside transistors 530 are shown as positive metal oxide semiconductor (PMOS) FinFETs. It should be recognized that aspects of the present disclosure are also applicable to planar transistors (e.g., CMOS planar transistors) and that other configurations of the front-side transistors 510 and the backside transistors 530 are also contemplated.

The integrated circuit structure 500 includes a front-side metallization 570 (e.g., a first BEOL interconnect (M1)) arranged in a front-side dielectric layer 504. The front-side metallization 570 is coupled to a first portion 550-1 of a backside metallization 550 through a via 560. The backside metallization 550 is in a backside dielectric layer 540. A second portion 550-2 of the backside metallization 550 is coupled to a multi-fin active device 590 (e.g., a multi-fin transistor). In addition, a third portion 550-3 of the backside metallization 550 is coupled to a wide-area active device 580 including, but not limited to, a metal oxide semiconductor (MOS) capacitor, a resistor, a varactor or other like wide-area active device. In addition, a handle substrate 502 is coupled to the front-side dielectric layer 504. The backside dielectric layer 540 is adjacent to and possibly supports the isolation layer 520. In this configuration, the post-layer transfer metallization process forms the backside metallization 550. As shown in FIG. 5, the front-side metallization 570 is arranged distal from the backside metallization 550.

According to aspects of the present disclosure, the handle substrate 502 may be composed of a semiconductor material, such as silicon. In this configuration, the handle substrate 502 may include at least one other active device. Alternatively, the handle substrate 502 may be a passive substrate to further improve harmonics by reducing parasitic capacitance. In this configuration, the handle substrate 502 may include at least one other passive device. As described herein, the term "passive substrate" may refer to a substrate of a diced wafer or panel, or may refer to the substrate of a wafer/panel that is not diced. In one configuration, the passive substrate is comprised of glass, quartz, sapphire, high-resistivity silicon, or other like passive material. The passive substrate may also be a coreless substrate.

Figure 6A:
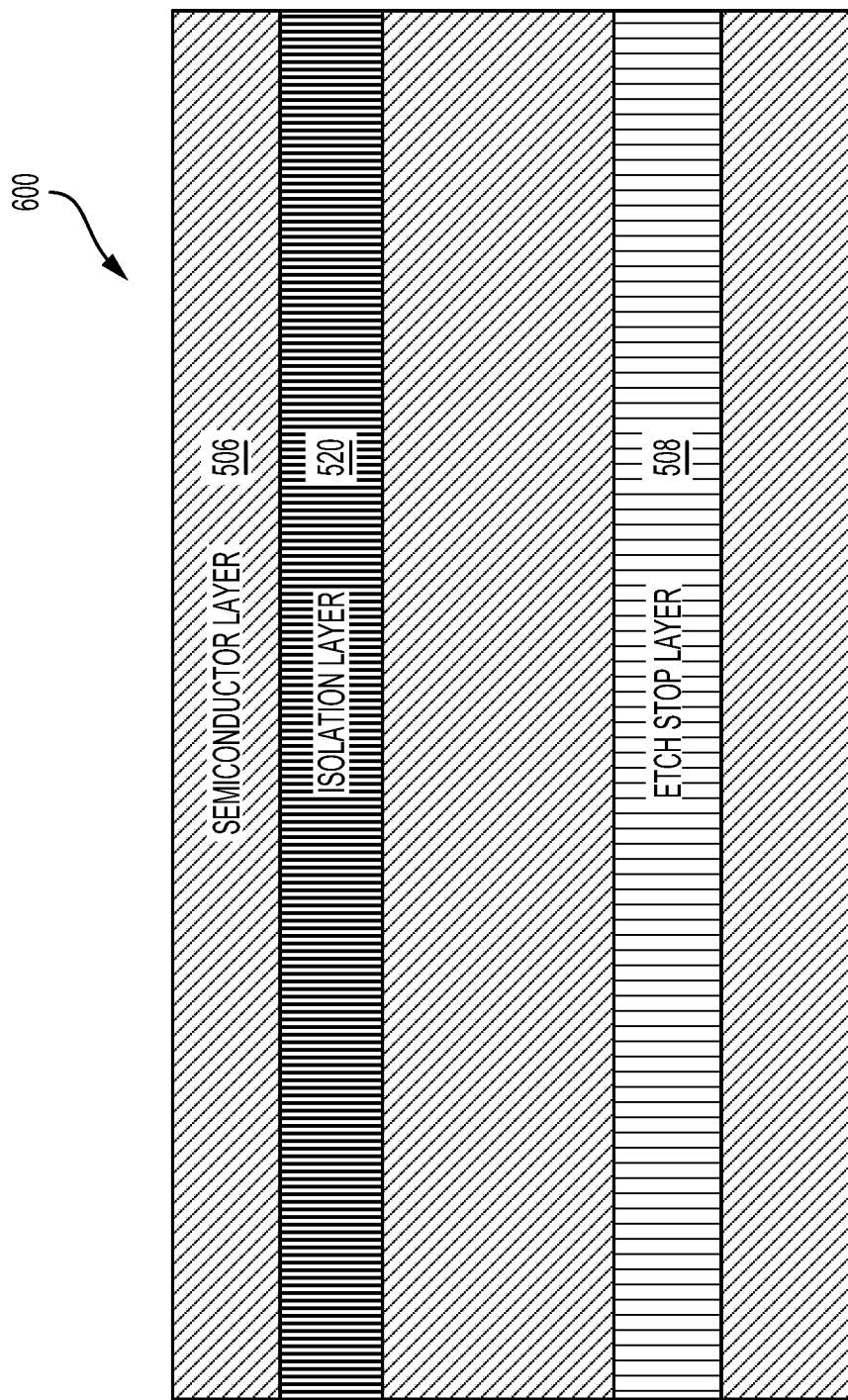
FIGS. 6A to 6J are cross-sectional views illustrating a process for fabricating an integrated circuit structure, including dual-sided, self-aligned and offset active devices according to aspects of the present disclosure.
Figure 6B:
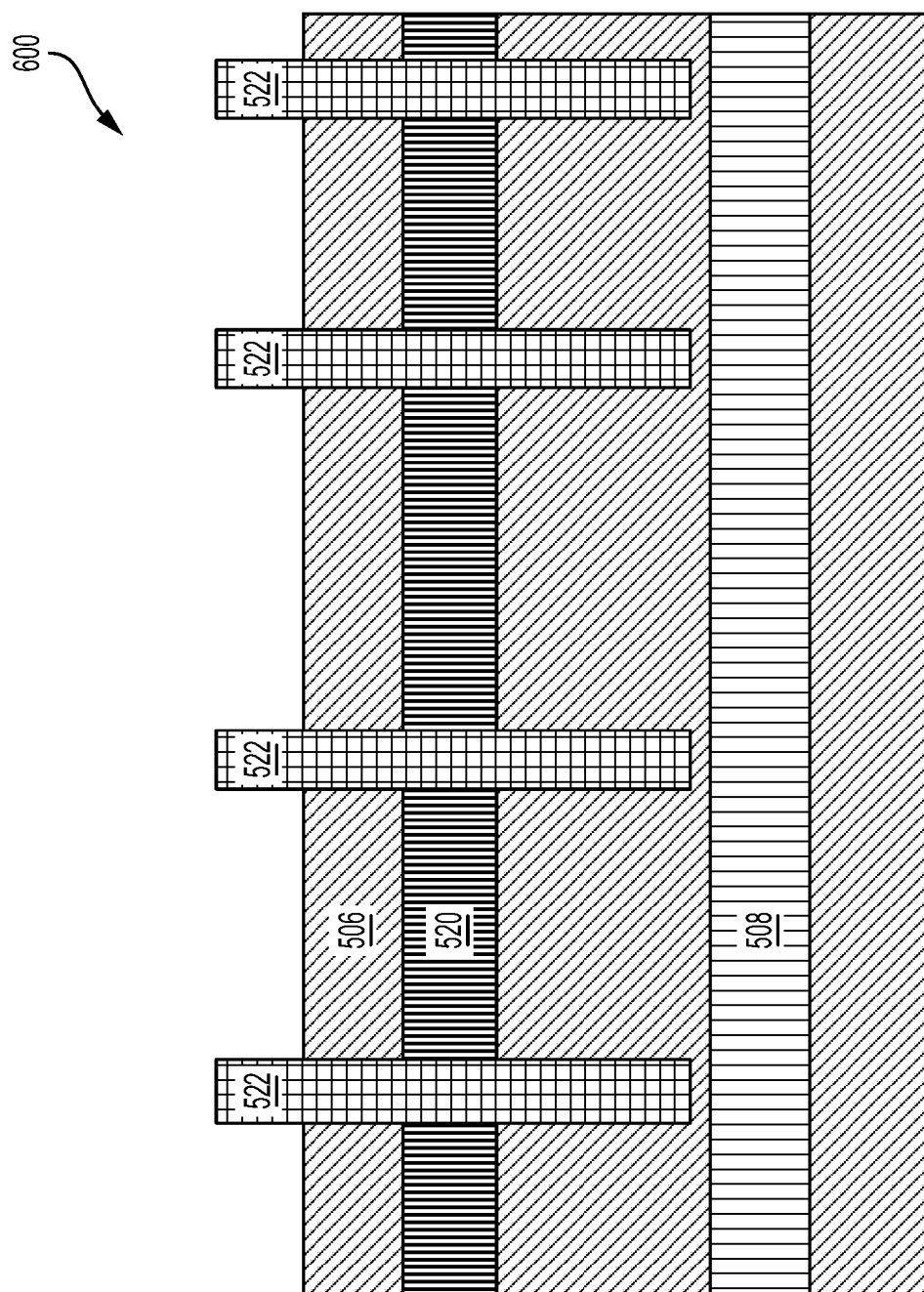
Figure 6C:
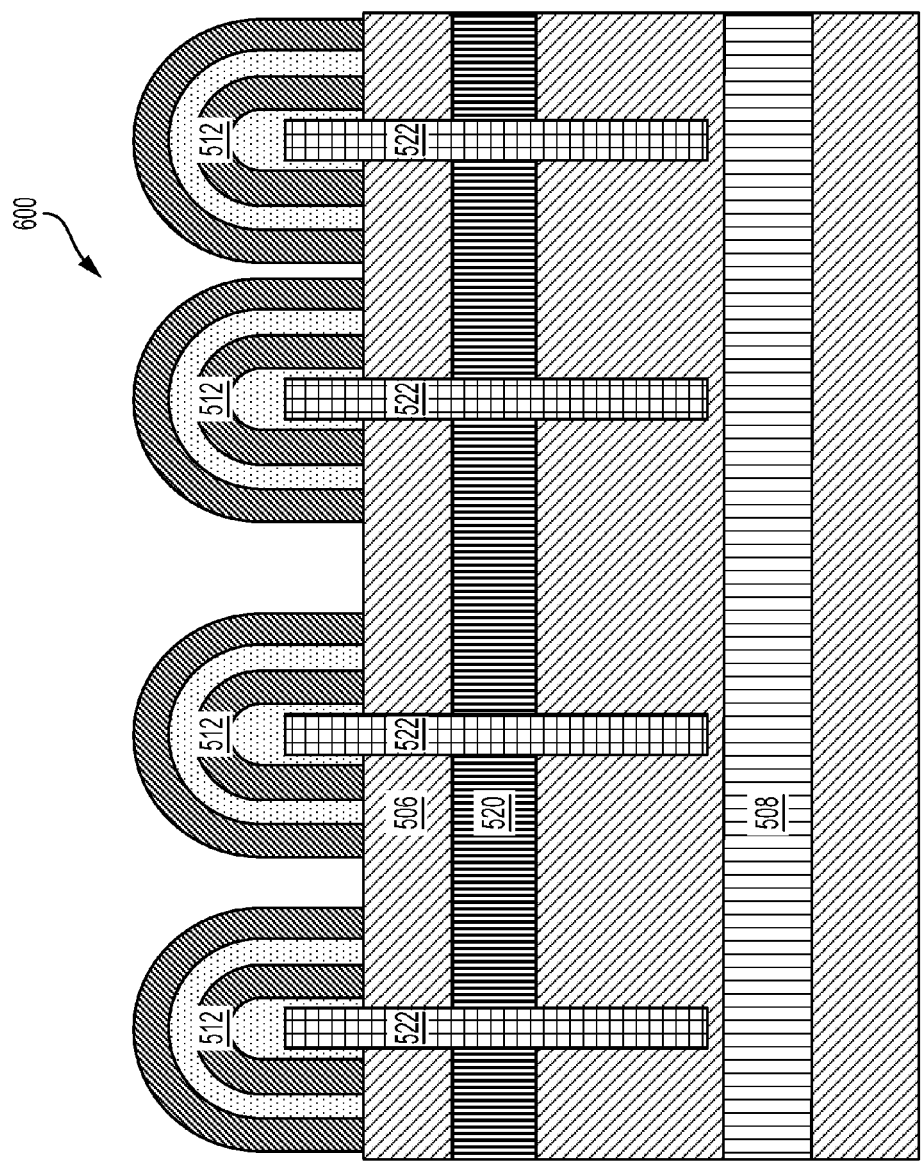
Figure 6D:
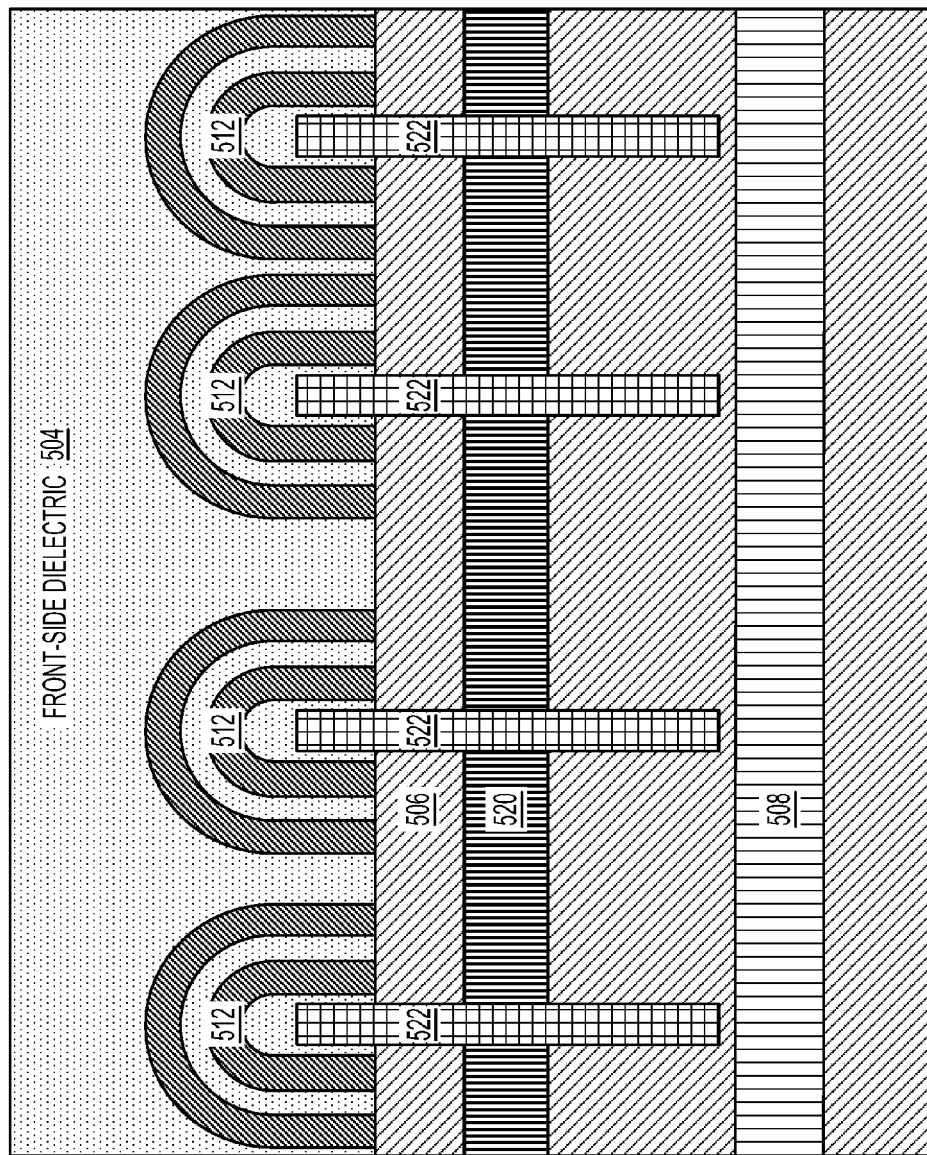
Figure 6E:
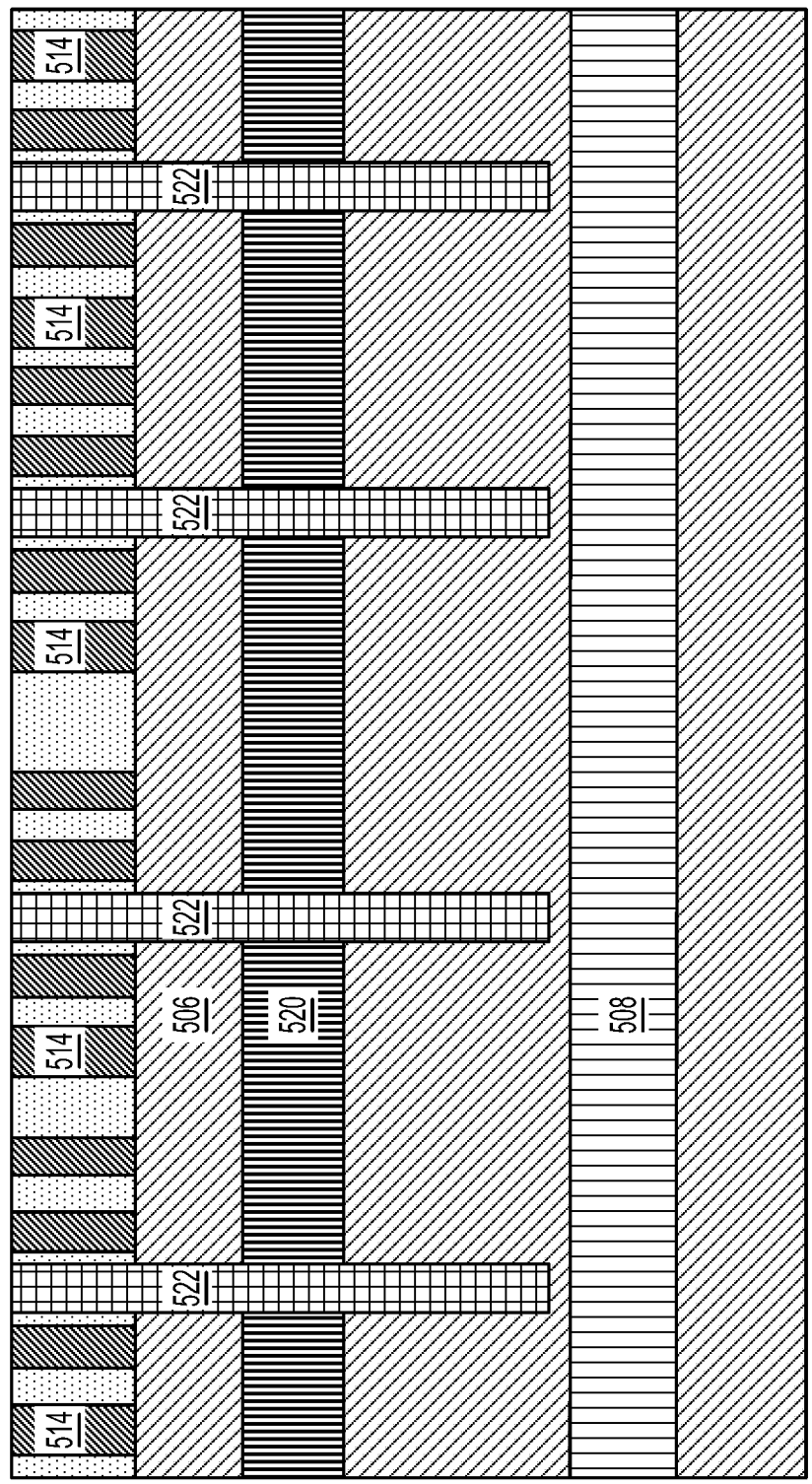
Figure 6F:
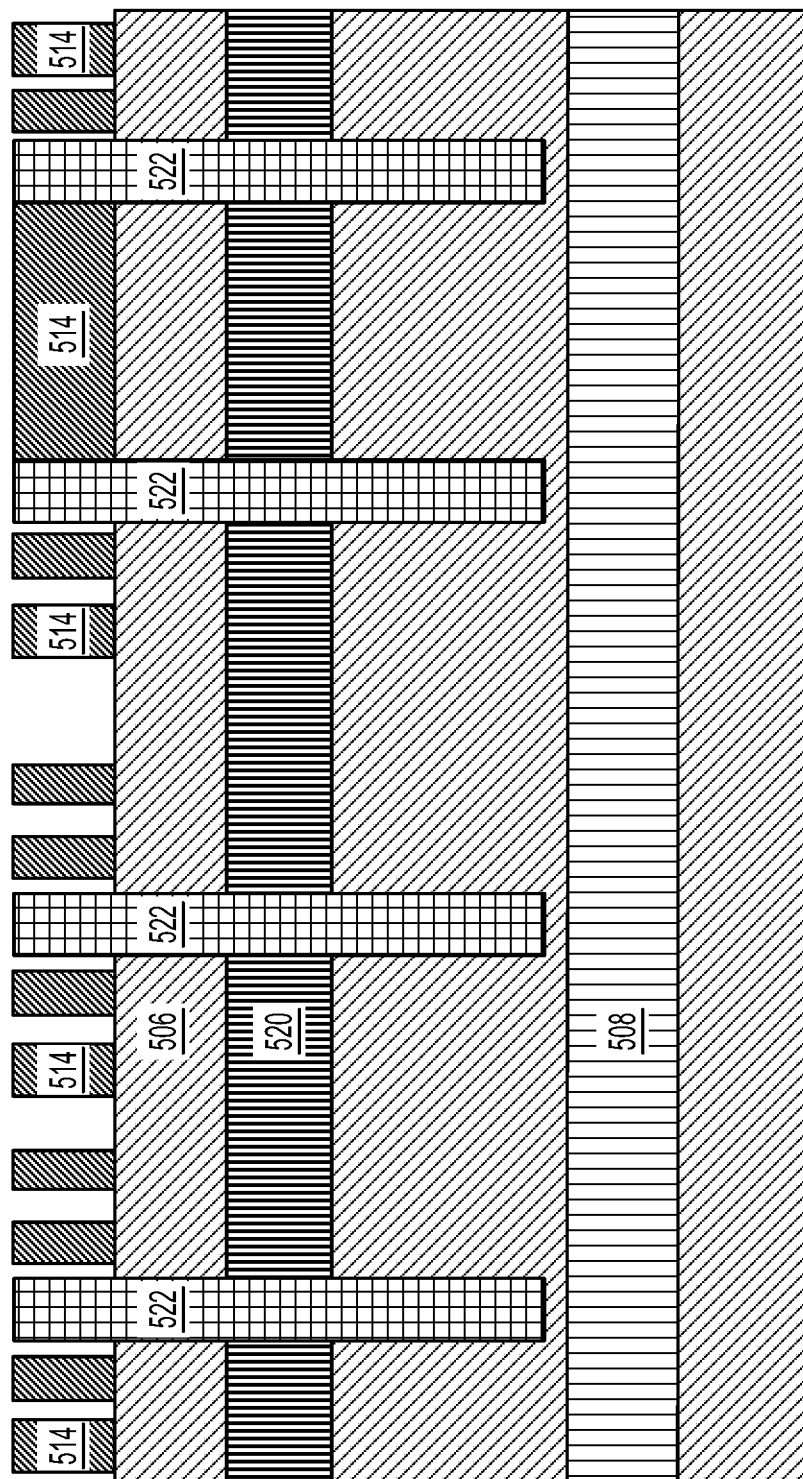
Figure 6G:
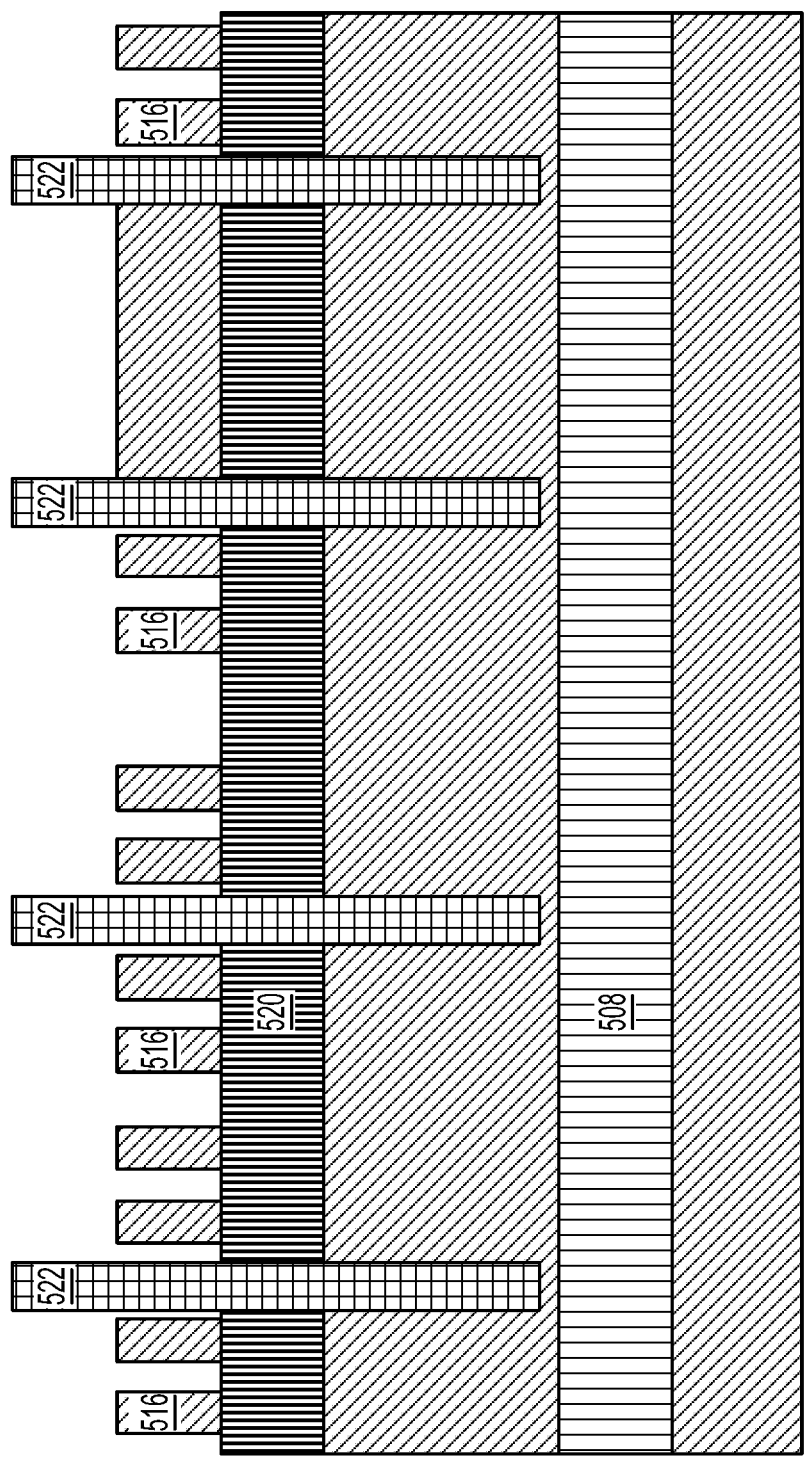
Figure 6H:
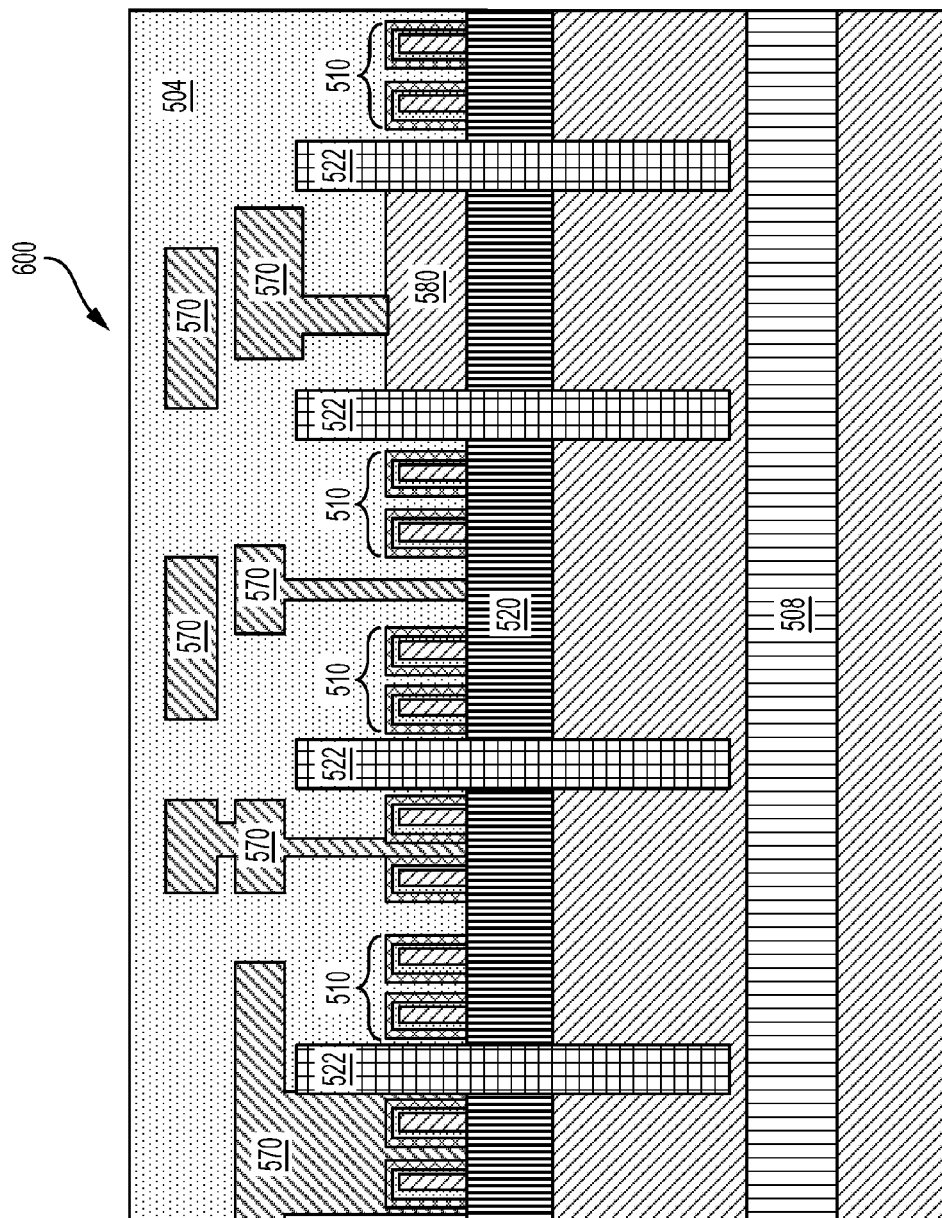
Figure 6I:
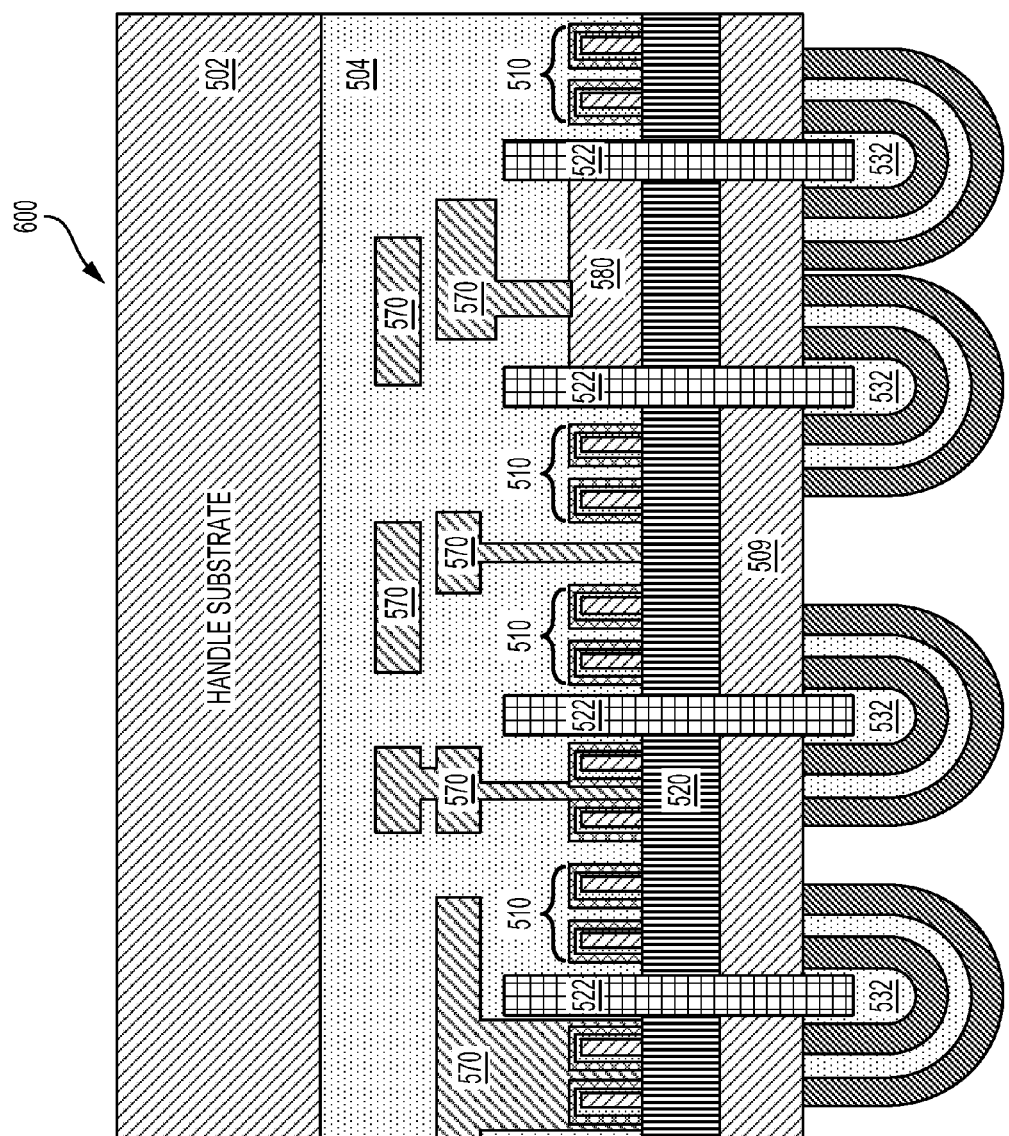
Figure 6J:
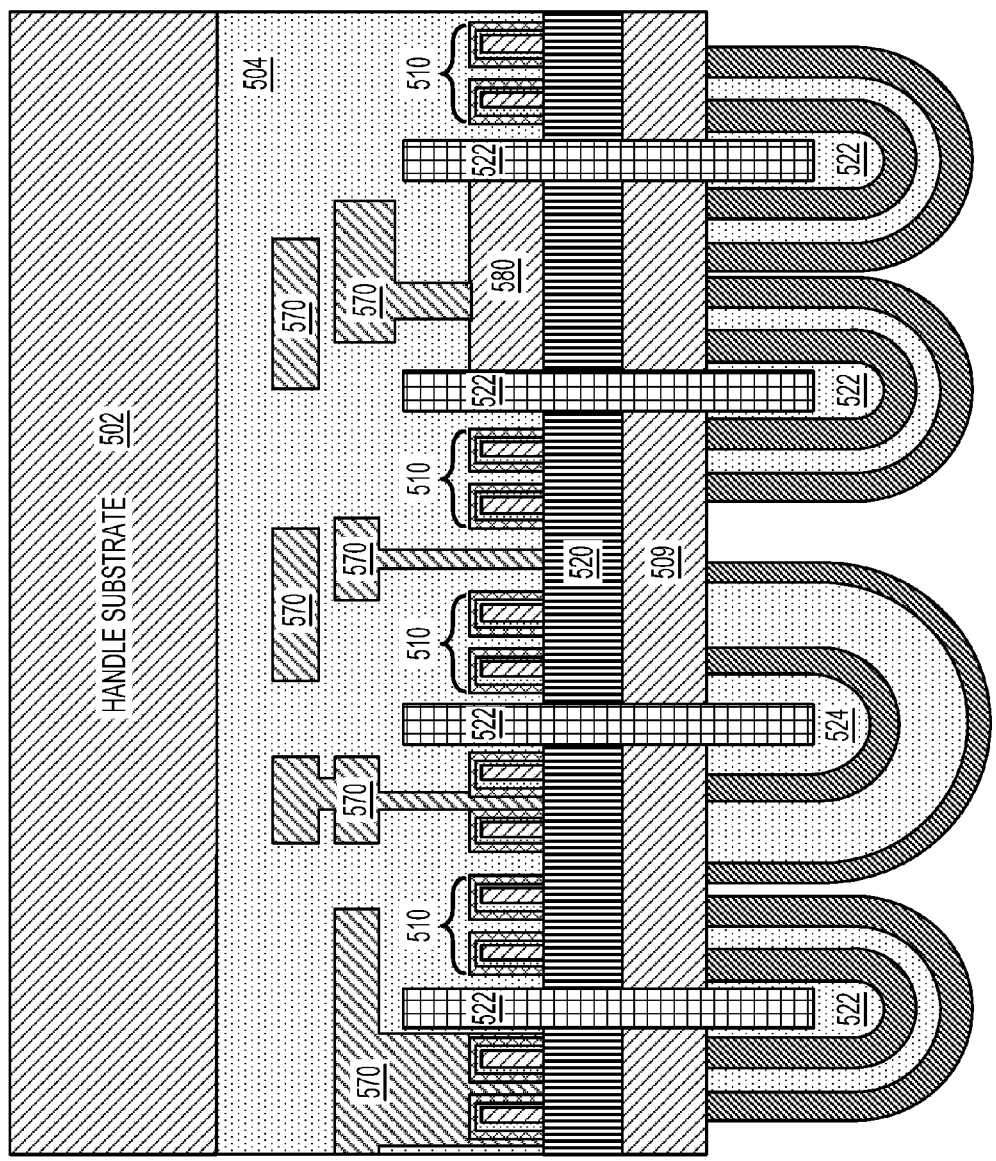
Figure 7:
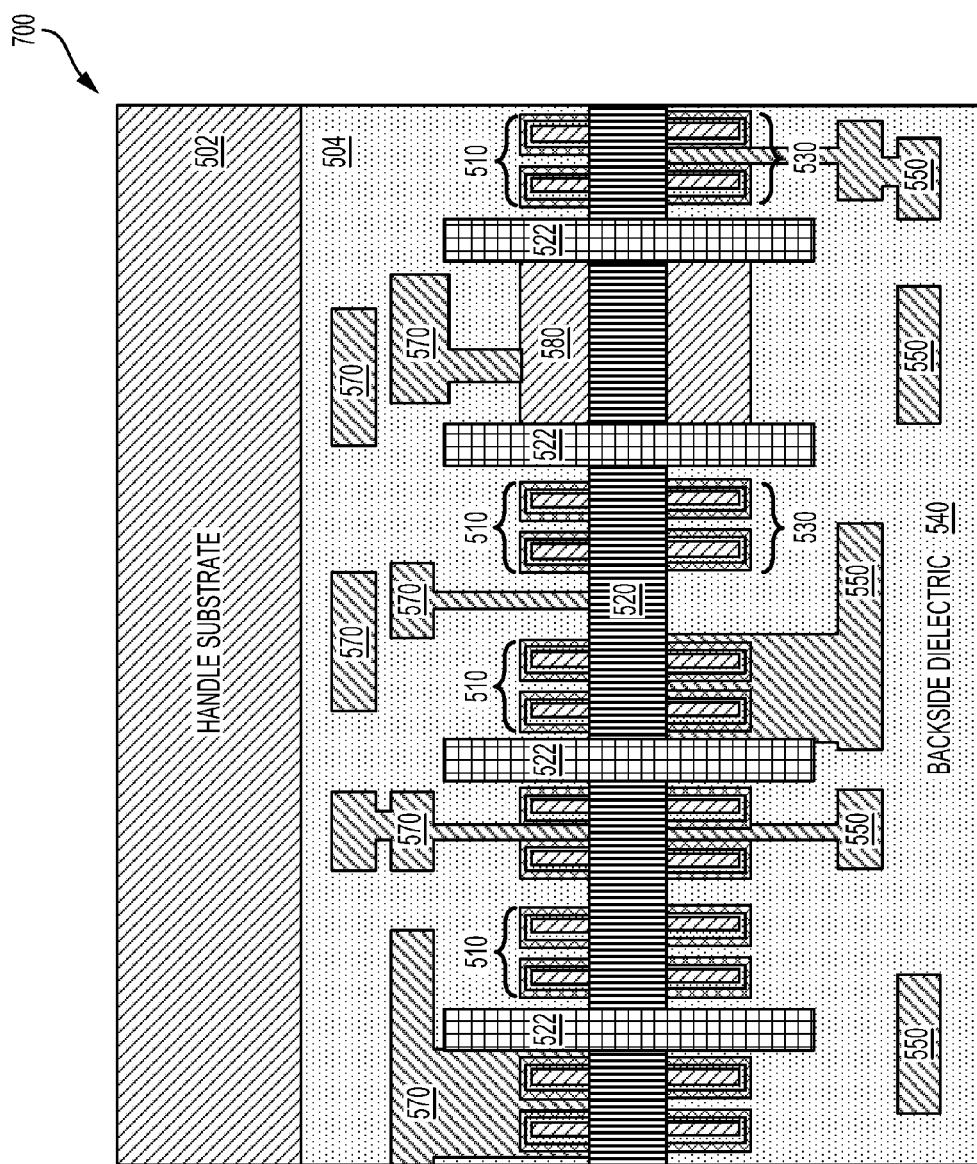
FIG. 7 is a cross-sectional view of an integrated circuit structure, including dual-sided, self-aligned active devices, according to aspects of the present disclosure.
Figure 8:
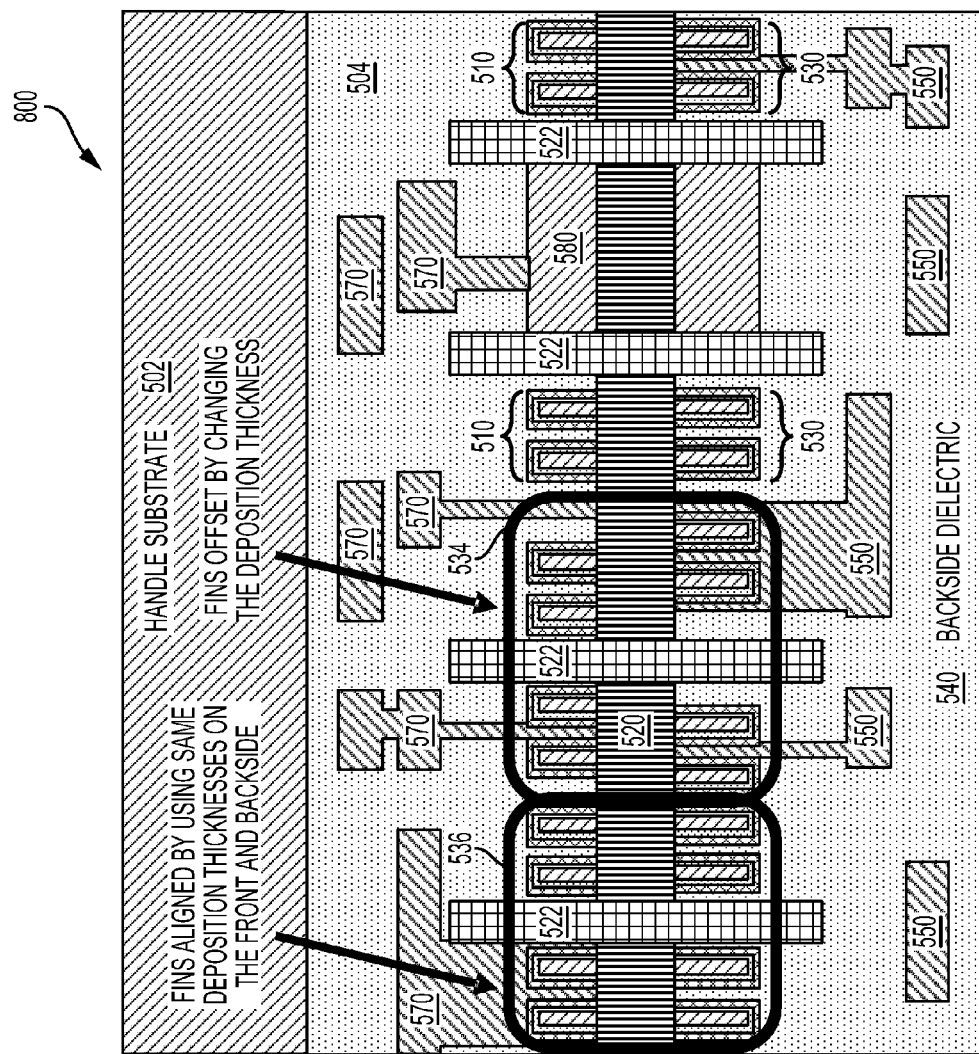
FIG. 8 is a cross-sectional view of an integrated circuit structure, including dual-sided, self-aligned and offset active devices, according to aspects of the present disclosure.

In aspects of the present disclosure, a post-layer transfer process forms dual-sided transistors that may be self-aligned, as shown in FIGS. 5 and 7, or offset, as shown in FIG. 8. The process of forming dual-sided, self-aligned transistors is shown in FIGS. 6A to 6I. A variation in the process is shown in FIG. 6J to enable the formation of an integrated circuit structure that includes a combination of dual-sided, self-aligned transistors and dual-sided, offset transistors, as shown in FIG. 8.

FIG. 6A shows a cross-sectional view of a bulk substrate 600 including an etch stop layer 508 according to aspects of the present disclosure. Representatively, the bulk substrate 600 includes a planarization layer (e.g., the etch stop layer 508), an isolation layer 520, and a front-side semiconductor layer 506. The isolation layer 520 is a buried oxide (BOX) layer for silicon on insulator (SOI) implementation of the front-side semiconductor layer 506. In aspects of the present disclosure, the etch stop layer 508 may be deposited as a porous semiconductor layer. The etch stop layer 508 may also be epitaxially grown as part of a post-layer transfer growth process. Alternatively, the etch stop layer 508 may be formed using ion implantation.

FIG. 6B is a cross-sectional view of the bulk substrate 600, including alignment columns according to aspects of the present disclosure. Representatively, alignment columns 522 are formed within the bulk substrate 600, extending through the front-side semiconductor layer 506 and through the isolation layer 520 toward the etch stop layer 508. The alignment columns 522 may be formed as deep trench isolation structures, such as a deep trench isolation column. This process includes a pad film deposition process followed by a deep trench etch process. Once the etch process is complete, the deep trench may be filed with an isolation material (e.g., an oxide). A chemical mechanical polish (CMP) process is then performed on the isolation material followed by pad removal to complete formation of the alignment columns 522. According to aspects of the present disclosure, the alignment columns provide a reference point for aligning or offsetting front-side and backside active devices.

FIG. 6C is a cross-sectional view of the bulk substrate 600, including deposited hardmask layers according to aspects of the present disclosure. In this arrangement, a pair of hardmask material layers separated by dielectric layers are deposited around the alignment columns 522 and a surface of the front-side semiconductor layer 506 to form front-side hardmask material layers 512. Although shown as a pair of hardmask material layers, it should be recognized that additional or fewer hardmask material layers are contemplated according to aspects of the present disclosure. As shown in the cross-sectional view of FIG. 6D, a front-side dielectric layer 504 (e.g., organic/inorganic oxide or a nitride) is deposited on the front-side hardmask material layers 512. Once deposited, a chemical mechanical polish (CMP) process is performed, as shown in FIG. 6E, and the remaining dielectric material is removed to form a front-side hardmask 514, as shown in FIG. 6F. As shown in FIG. 6G, the front-side semiconductor layer 506 is etched to form front-side fins 516. This etch process may be performed by using a sidewall image transfer (SIT) and/or a cut mask.

FIG. 6H is a cross-sectional view of the bulk substrate 600, including front-side transistors 510 according to aspects of the present disclosure. In this arrangement, a front-side CMOS process is performed to form the front-side transistors 510, which are coupled to front-side metallization 570, which may include contacts and vias formed within a front-side dielectric layer 504. A dual-sided active device 580 is also shown. Once the front-side dielectric layer 504 is deposited, a layer transfer process is performed to bond a handle substrate to the front-side dielectric layer 504 and to enable formation of backside transistors according to aspects of the present disclosure.

FIG. 6I is a cross-sectional view of the bulk substrate 600, including deposited, backside hardmask layers according to aspects of the present disclosure. Prior to deposition of backside hardmask material layers 532, a backside of the bulk substrate 600 is etched, stopping on the etch stop layer 508. Next, the etch stop layer 508 is removed to expose a backside semiconductor layer 509 on a backside of the isolation layer 520. In a silicon on insulator (SOI) implementation, the backside semiconductor layer 509 is an unprocessed SOI layer. As will be recognized, a configuration of the backside hardmask material layers 532 is similar to the configuration of the front-side hardmask material layers 512 of FIG. 6C to enable the formation of self-aligned front-side and backside transistors, as shown in FIG. 7. In the configuration shown in FIG. 6J, however, offset backside hardmask materials 524 are deposited. Depositing hardmask material layers of different widths (e.g., different deposition thicknesses) on either the front-side semiconductor layer 506 or the backside semiconductor layer 509 enables an offset between the front-side and backside transistors, as shown in FIG. 8.

FIG. 7 is a cross-sectional view of an integrated circuit structure 700, including dual-sided, self-aligned transistors, according to aspects of the present disclosure. This aspect of the present disclosure also solves the problem of reduced transistor density associated with conventional CMOS fabrication processes by providing self-aligned front-side and backside transistors using a post-layer transfer process. As will be recognized, a configuration of the integrated circuit structure 700 is similar to the configuration of the integrated circuit structure 500 of FIG. 5. In the configuration shown in FIG. 7, however, front-side transistors 510 are arranged on opposing sides of a dual-sided active device 580, on a front-side of the isolation layer 520. Similarly, backside transistors 530 are arranged on opposing sides of the dual-sided active device 580, on a backside of the isolation layer 520. In addition, the front-side transistors 510 and the backside transistors 530 are shown as negative metal oxide semiconductor (NMOS) fin-type field effect transistors (FinFETs).

FIG. 8 is a cross-sectional view of an integrated circuit structure 800, including a combination of dual-sided, self-aligned and offset transistors, according to aspects of the present disclosure. As will be recognized, a configuration of the integrated circuit structure 800 is similar to the configuration of the integrated circuit structure 700 of FIG. 7. In the configuration shown in FIG. 8, however, the front-side transistors 510 are offset from the backside transistors 530 in the box 534. In this arrangement, a second front-side transistor 510 is offset from a second backside transistor 530. By contrast, the front-side transistors 510 and the backside transistors 530 are self-aligned in box 536. In this arrangement, a first front-side transistor is aligned with a first backside transistor. The offset of the front-side transistors 510 and the backside transistors 530 shown in the box 534 may be performed by using different thickness for the dielectric layers of the deposited hardmask material layers, for example, as shown in FIG. 6J.

In the configuration shown in FIG. 8, the front-side transistors 510 and the backside transistors 530 are also shown as negative metal oxide semiconductor (NMOS) fin-type field effect transistors (FinFETs). It should be recognized that aspects of the present disclosure may be applied to form dual-sided, self-aligned gates as well as dual-sided, offset gates for planar CMOS devices. Self-aligned vias can be fabricated by etching an alignment column and filling it with conductive material. Self-aligned contacts and conductive layers can also be provided, according to aspects of the present disclosure.

Figure 9:
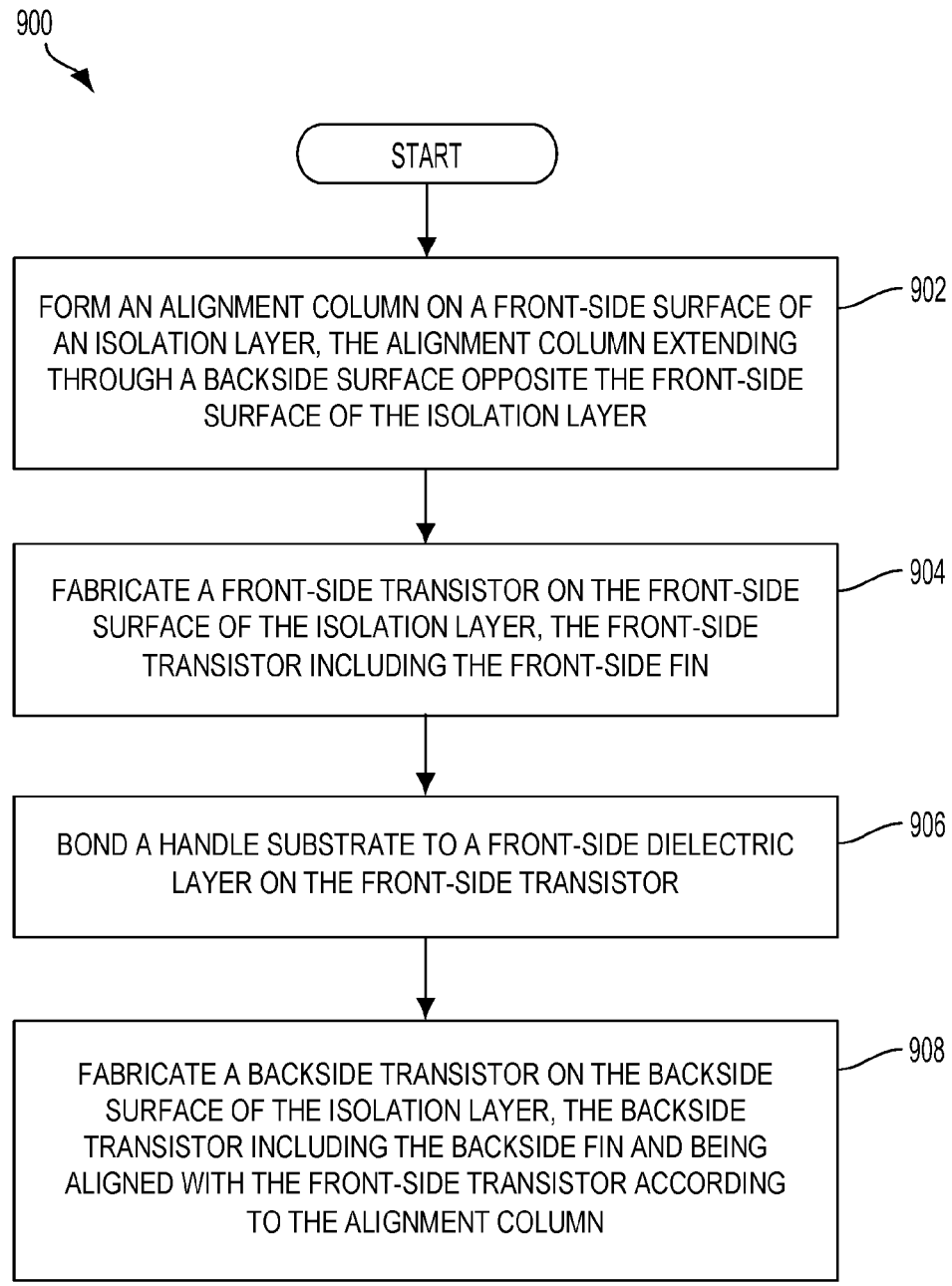
FIG. 9 is a process flow diagram illustrating a method of constructing an integrated circuit structure including dual-sided, self-aligned transistors, according to an aspect of the present disclosure.

FIG. 9 is a process flow diagram illustrating a method 900 of constructing an integrated circuit structure, including dual-side, self-aligned transistors, according to an aspect of the present disclosure. In block 902, an alignment column is formed on a front-side surface of an isolation layer. The alignment column extends through a backside surface opposite the front-side surface of the isolation layer. For example, as shown in FIG. 6B, alignment columns 522 are fabricated in a bulk substrate 600. The alignment columns 522 extend through a front-side semiconductor layer 506 (e.g., a silicon on insulator (SOI) layer) and an isolation layer 520 (e.g., a buried oxide (BOX) layer) toward an etch stop layer 508 of a bulk substrate 600.

Referring again to FIG. 9, in block 904, a front-side transistor is fabricated on the front-side surface of the isolation layer. The front-side transistor includes a front-side fin. For example, as shown FIGS. 6C to 6H, fabrication of front-side transistors 510 begins with formation of a front-side hardmask 514 on a surface of the front-side semiconductor layer 506, as shown in FIG. 6F. Formation of the front-side hardmask 514 is shown in FIGS. 6C to 6E, including deposition of the front-side hardmask material layers 512 (FIG. 6C), followed by etching of these materials (FIG. 6E) to form the front-side hardmask 514 on the surface of the front-side semiconductor layer 506, as shown in FIG. 6F. As shown in FIG. 6G, the front-side semiconductor layer is etched according to the front-side hardmask 514 to form front-side fins 516 supported by the front-side surface of the isolation layer 520. FIG. 6H shows the front-side fins 516 following, for example, CMOS processes to form front-side transistors 510, arranged between the alignment columns 522. This portion of the process for fabricating the front-side transistors is performed prior to a layer transfer process.

Referring again to FIG. 9, at block 906, a handle substrate is bonded to a front-side dielectric layer on the front-side transistor. For example, the layer transfer process is performed, in which a handle substrate 502 is bonded to a front-side dielectric layer 504, as shown in FIG. 6I. The layer transfer process also includes removal of a portion of the bulk substrate 600. As shown in FIG. 3B, the layer transfer process includes removal of the sacrificial substrate 301. As shown in FIG. 6I, the partial removal of the bulk substrate 600 exposes a backside semiconductor layer 509, which may be an unprocessed layer of silicon. In this aspect of the present disclosure, fabrication of backside transistors is performed as part of a post-layer transfer process.

Referring again to FIG. 9, in block 908, a backside transistor is fabricated on the backside surface of the isolation layer. The backside transistor includes a backside fin and is aligned with the front-side transistor according to the alignment column. For example, as shown in FIG. 6I, a post-layer transfer backside formation process may begin with formation of a backside hardmask on a surface of the backside semiconductor layer 509. Formation of the backside hardmask is similar to formation of the front-side hardmask 514, as shown in FIGS. 6C to 6E, including deposition of backside hardmask material layers 532 (FIG. 6I), followed by etching of these materials (FIG. 6E) to form the backside hardmask on the surface of the backside semiconductor layer 509. The backside semiconductor layer is etched according to the backside hardmask to form backside semiconductor fins supported by the backside surface of the isolation layer 520. FIG. 7 shows the backside semiconductor fins following, for example, CMOS processes to form backside transistors 530, arranged between the alignment columns 522.

According to a further aspect of the present disclosure, an integrated circuit structure, including dual-side, self-aligned transistors, is described. The integrated circuit structure also includes front-side transistors on a front-side surface of an isolation layer and backside transistors on a backside surface of the isolation layer. The integrated circuit structure includes means for aligning a first front-side transistor with a first backside transistor. The aligning means may be the alignment columns, shown in FIG. 5. In another aspect, the aforementioned means may be any module or any apparatus configured to perform the functions recited by the aforementioned means.

Conventional front-end-of-line (FEOL) processes are generally limited to CMOS transistor formation on one side of a semiconductor wafer. That is, conventional CMOS transistor fabrication technology is limited to transistor fabrication on a front-side of the semiconductor, which limits transistor density. As a result, aspects of the present disclosure include a post-layer transfer process to enable self-aligned transistors for dual-side processing.

By contrast, access to active devices, formed during a front-end-of-line (FEOL) process, is conventionally provided during middle-end-of-line (MEOL) processing that provides contacts between the gates and source/drain regions of the active devices and back-end-of-line (BEOL) interconnect layers (e.g., M1, M2, etc.). Aspects of the present disclosure involve a post layer transfer process for forming dual-sided, self-aligned transistors that may be used as antenna switch transistors in integrated radio frequency (RF) circuit structures for high quality (Q)-factor RF applications. Other applications include an active device in a low power amplifier module, a low noise amplifier, and an antenna diversity switch.

Figure 10:
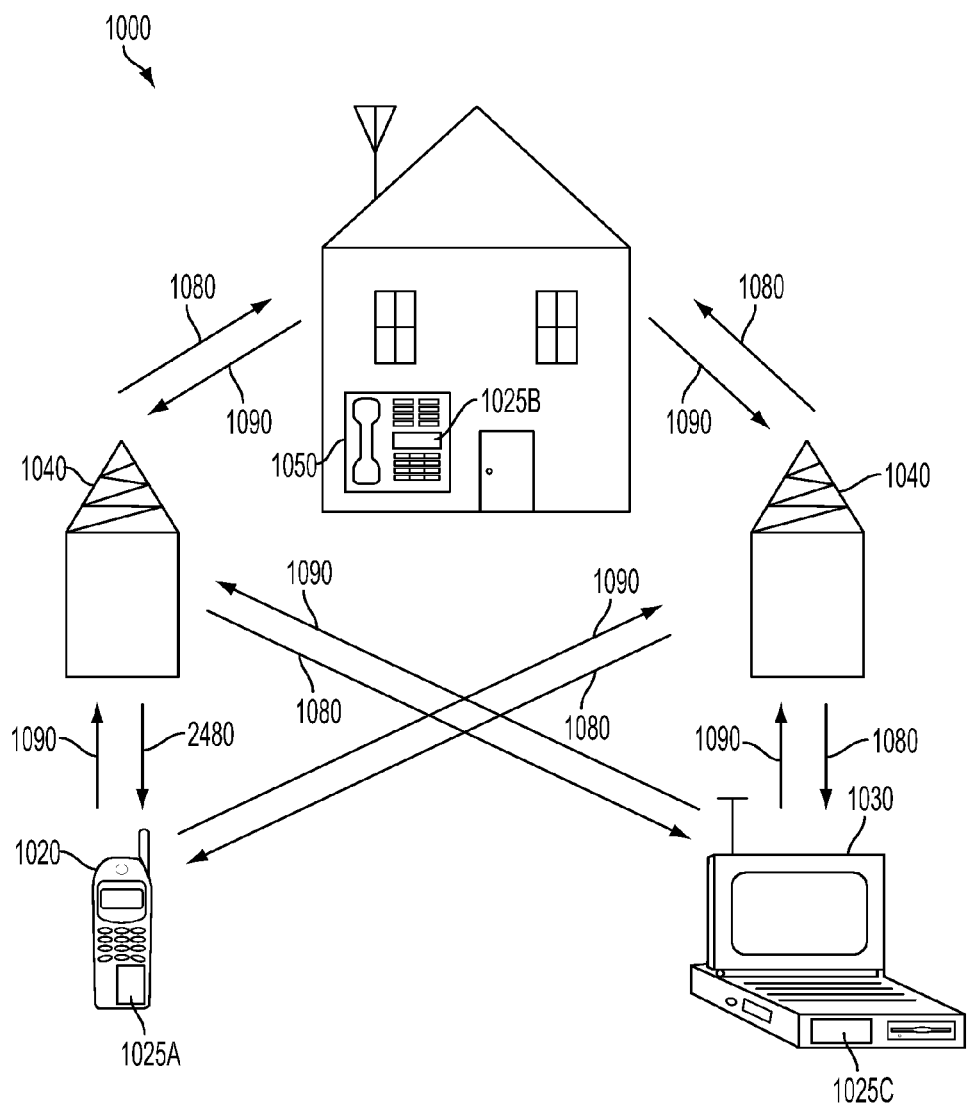
FIG. 10 is a block diagram showing an exemplary wireless communication system in which a configuration of the disclosure may be advantageously employed.

FIG. 10 is a block diagram showing an exemplary wireless communication system 1000 in which an aspect of the disclosure may be advantageously employed. For purposes of illustration, FIG. 10 shows three remote units 1020, 1030, and 1050 and two base stations 1040. It will be recognized that wireless communication systems may have many more remote units and base stations. Remote units 1020, 1030, and 1050 include IC devices 1025A, 1025C, and 1025B that include the disclosed dual-side, self-aligned transistors. It will be recognized that other devices may also include the disclosed dual-side, self-aligned transistors, such as the base stations, switching devices, and network equipment. FIG. 10 shows forward link signals 1080 from the base station 1040 to the remote units 1020, 1030, and 1050 and reverse link signals 1090 from the remote units 1020, 1030, and 1050 to base stations 1040.

In FIG. 10, remote unit 1020 is shown as a mobile telephone, remote unit 1030 is shown as a portable computer, and remote unit 1050 is shown as a fixed location remote unit in a wireless local loop system. For example, a remote units may be a mobile phone, a hand-held personal communication systems (PCS) unit, a portable data unit such as a personal digital assistant (PDA), a GPS enabled device, a navigation device, a set top box, a music player, a video player, an entertainment unit, a fixed location data unit such as a meter reading equipment, or other communications device that stores or retrieve data or computer instructions, or combinations thereof. Although FIG. 10 illustrates remote units according to the aspects of the disclosure, the disclosure is not limited to these exemplary illustrated units. Aspects of the disclosure may be suitably employed in many devices, which include the disclosed dual-side, self-aligned transistors.

Figure 11:
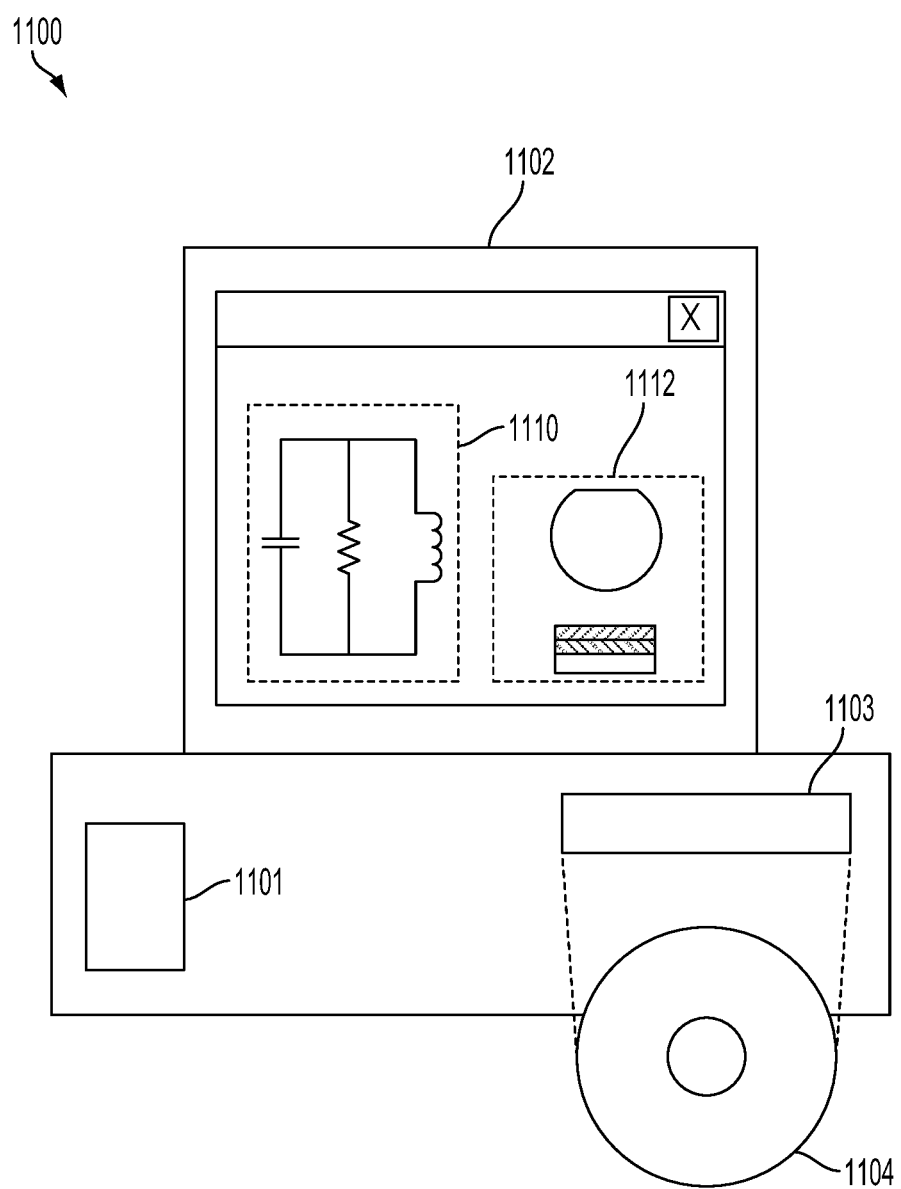
FIG. 11 is a block diagram illustrating a design workstation used for circuit, layout, and logic design of a semiconductor component according to one configuration.

FIG. 11 is a block diagram illustrating a design workstation used for circuit, layout, and logic design of a semiconductor component, such as the dual-side, self-aligned transistors disclosed above. A design workstation 1100 includes a hard disk 1101 containing operating system software, support files, and design software such as Cadence or OrCAD. The design workstation 1100 also includes a display 1102 to facilitate design of a circuit 1110 or a semiconductor component 1112 such as a dual-side, self-aligned transistor. A storage medium 1104 is provided for tangibly storing the circuit design 1110 or the semiconductor component design 1112. The circuit design 1110 or the semiconductor component design 1112 may be stored on the storage medium 1104 in a file format such as GDSII or GERBER. The storage medium 1104 may be a CD-ROM, DVD, hard disk, flash memory, or other appropriate device. Furthermore, the design workstation 1100 includes a drive apparatus 1103 for accepting input from or writing output to the storage medium 1104.

Data recorded on the storage medium 1104 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1104 facilitates the design of the circuit design 1110 or the semiconductor component design 1112 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

What is claimed is:

1. An integrated circuit structure, comprising:
    an alignment column on a front-side surface of an isolation layer and extending through a backside surface opposite the front-side surface of the isolation layer;
    a plurality of front-side transistors on the front-side surface of the isolation layer; and
    a plurality of backside transistors on the backside surface of the isolation layer, in which a first front-side transistor is self-aligned with a first backside transistor relative to the alignment column.

2. The integrated circuit structure of claim 1, comprising:
    in which the plurality of front-side transistors comprise front-side fin-type field effect transistors (FinFETs), and
    the plurality of backside transistors comprise backside fin-type field effect transistors (FinFETs), and in which a fin of a first front-side FinFET is aligned with a fin of a first backside FinFET.

3. The integrated circuit structure of claim 1, in which the plurality of front-side transistors and the plurality of backside transistors comprises gate all around nanowires, nanowires, or vertical transistors.

4. The integrated circuit structure of claim 1, in which the plurality of front-side transistors and the plurality of backside transistors comprises planar transistors, in which a gate of the first front-side transistor is aligned with a gate of the first backside transistor.

5. The integrated circuit structure of claim 1, in which the alignment column comprises a deep trench isolation column.

6. The integrated circuit structure of claim 1, in which a second front-side transistor is offset from a second backside transistor.

7. The integrated circuit structure of claim 1, further comprising:

a via coupling the first front-side transistor and the first backside transistor, in which the via is self-aligned relative to the alignment column.

8. The integrated circuit structure of claim 1, in which the first front-side transistor and the first backside transistor comprises a radio frequency (RF) switch.

9. The integrated circuit structure of claim 1, integrated into a radio frequency (RF) front end module, the RF front end module incorporated into at least one of a music player, a video player, an entertainment unit, a navigation device, a communications device, a personal digital assistant (PDA), a fixed location data unit, a mobile phone, and a portable computer.

10. The integrated circuit structure of claim 1, in which the first front-side transistor and a second front-side transistor are self-aligned relative to the alignment column between the first front-side transistor and the second front-side transistor.

11. The integrated circuit structure of claim 1, in which the first backside transistor and a second backside transistor are self-aligned relative to the alignment column between the first backside transistor and the second backside transistor.

12. A radio frequency (RF) front end module, comprising:

an integrated RF circuit structure, comprising an alignment column on a front-side surface of an isolation layer and extending through a backside surface opposite the front-side surface of the isolation layer, a plurality of front-side transistors on the front-side surface of the isolation layer, and a plurality of backside transistors on the backside surface of the isolation layer, in which a first front-side transistor is self-aligned with a first backside transistor relative to the alignment column;

a switch transistor comprising the first front-side transistor and the first backside transistor; and an antenna coupled to an output of the switch transistor.

13. The RF front end module of claim 12, incorporated into at least one of a music player, a video player, an entertainment unit, a navigation device, a communications device, a personal digital assistant (PDA), a fixed location data unit, a mobile phone, and a portable computer.

* * * * *